(12) United States Patent
Groezing et al.

(10) Patent No.: US 8,346,835 B2
(45) Date of Patent: Jan. 1, 2013

(54) FILTER STRUCTURE AND METHOD FOR FILTERING AN INPUT SIGNAL

(75) Inventors: Markus Groezing, Stuttgart (DE); Manfred Berroth, Sindelfingen (DE)

(73) Assignee: Universitaet Stuttgart (DE)

( * ) Notice: Subject to any disclaimer, the term of this patent is extended or adjusted under 35 U.S.C. 154(b) by 1014 days.

(21) Appl. No.: 12/374,867

(22) PCT Filed: Jul. 7, 2007

(86) PCT No.: PCT/EP2007/006040
§ 371 (c)(1),
(2), (4) Date: Jan. 23, 2009

(87) PCT Pub. No.: WO2008/011977
PCT Pub. Date: Jan. 31, 2008

(65) Prior Publication Data
US 2009/0327385 A1 Dec. 31, 2009

(30) Foreign Application Priority Data
Jul. 24, 2006 (DE) .......................... 10 2006 034 033

(51) Int. Cl.
*H03H 15/02* (2006.01)
*H03H 17/06* (2006.01)
(52) U.S. Cl. ........................................ 708/300; 708/301
(58) Field of Classification Search .................... None
See application file for complete search history.

(56) References Cited

U.S. PATENT DOCUMENTS
4,821,223 A * 4/1989 David ........................ 708/308
(Continued)

FOREIGN PATENT DOCUMENTS
WO 2005033902 4/2005

OTHER PUBLICATIONS

Xiaodong Wang et al: "A Low-Power 170-MHz Discrete-Time Analog FIR Filter" IEEE Journal of Solid-State Circuits, IEEE Service Center, Piscataway, NJ, US, vol. 33, No. 3, Mar. 1998, XP011060700 ISSN: 0018-9200.

*Primary Examiner* — Ilwoo Park
(74) *Attorney, Agent, or Firm* — Donald R. Boys; Central Coast Patent Agency, Inc.

(57) ABSTRACT

The invention relates to a method and filter structure for filtering an input signal, which is applied to an input (1) of the filter structure, having a symbol rate. The input signal is guided to multiple parallel branches of the filter structure connected to the input (1), in which at least two sequence holding members (4) are each disposed. Symbol values of the input signal, which are applied to the outputs of the sequence holding members (4) at certain points are guided to multiple (N) parallel signal addition units (3) having weighted inputs. One output signal each is generated in the signal addition units (3) as the sum of the weighted symbol values that are applied to the inputs. According to the invention, space and energy saving filter structure is provided, wherein: the same amount of sequence holding members (4.1, 4.2, 4.3) is disposed in each of the parallel branches; as many signal addition units (3.1, 3.2, 3.3, 3.4) are disposed in the filter structure as the amount of parallel branches are provided in the filter structure; the sequence holding members (4.1, 4.2, 4.3) and addition units (3.1, 3.2, 3.3, 3.4) are nested inside each other; and the sequence holding members die (4.1, 4.2, 4.3) and the signal addition units (3) are controlled via a multi-phase clock signal (F1 to 4).

14 Claims, 12 Drawing Sheets

U.S. PATENT DOCUMENTS

| | | | |
|---|---|---|---|
| 6,330,292 B1 * | 12/2001 | Dent et al. | 375/343 |
| 6,343,094 B1 * | 1/2002 | Yamamoto | 375/152 |
| 6,529,926 B1 | 3/2003 | Capofreddi | |
| 6,553,398 B2 | 4/2003 | Capofreddi | |
| 6,768,372 B2 | 7/2004 | Jaussi | |
| 2005/0193047 A1 * | 9/2005 | Fu et al. | 708/300 |

* cited by examiner

FILTER STRUCTURE AND METHOD FOR FILTERING AN INPUT SIGNAL

CROSS-REFERENCE TO RELATED DOCUMENTS

The present application claims priority to German patent application serial number DE 10 2006 034 033.7, which was filed on Jul. 24, 2006, which is incorporated herein in its entirety, at least by reference.

The present invention relates to a multiple parallel filter with a finite impulse response (FIR) for filtering an input signal. In particular, the invention relates to a filter structure comprising:
- an input with an input signal having a symbol rate R is applied,
- several N parallel branches connected to the input with at least two analog clocked delay elements located inside said branches with N being an even number,
- several N parallel signal addition units connected to the outputs of the delay elements each having several K-weighted inputs with the number of signal addition units being equal to the number of parallel branches provided in the filter structure, and
- a control network that guides a multiphase clock signal with multiple N individual clock signals with the individual clock signals exhibiting the same shape, being offset from each other by a sampling period duration T and the number N of individual clock signals of the multiphase clock signal being equal to the number N of the parallel branches, and for controlling the delay elements with the multiphase clock signal.

In addition, the invention relates to a method for filtering an input signal that is present at an input of a filter structure and that has a symbol rate R, whereby
- the input signal is guided via several N parallel branches of the filter structure connected to the input, with at least two analog clocked delay elements located in series inside said branches, with N being an even number,
- several N parallel signal addition units being connected to the outputs of the delay elements with several K-weighted inputs, with the number N of signal addition units being equal to the number of parallel branches provided in the filter structure, and
- a multiphase clock signal with several N individual clock signals being guided to the filter structure, whereby the individual clock signals exhibit the same shape, are offset from each other by a sampling period duration T, and where the number N of individual clock signals of the multiphase clock signal is equal to the number N of the parallel branches being provided in the filter structure, and where the delay elements are controlled using the multiphase clock signal.

The input signal is guided to N parallel branches of the filter structure that are connected to the input and that have at least two analog-clocked delay elements arranged in them. Present at the outputs of the delay elements are sampled symbol values of the input signal, which are taken from the input signal at certain points in time specified by a sampling period duration T of the filter structure. These symbol values are guided to N signal addition units with weighted inputs. An output signal as the sum of a suitable number of K pieces of certain weighted symbol values present at the output of the delay elements is generated in the N signal addition units. Various methods for filtering distortions out of a fast serial data stream with binary, duo-binary or x-times pulse amplitude modulation are known from the state-of-the-art. The cause of the distortions may be certain limitations in data transfer, for example a transfer via a dispersive, i.e., a bandwidth-limited channel. Distortions in the transferred signals lead to widening of the individual data symbols and to a reduced amplitude. Through the widening, the individual consecutive data symbols overlap (co-called intersymbol interference, ISI) and can no longer be detected independent of the preceding and following data symbols. If the distortion of the input signal at the receiver exceeds a certain degree, the distorted signal can no longer be detected using a simple decision device. More sophisticated techniques are then required to minimize distortion in the transferred signal. Known methods for distortion correction or filtering of data streams include:

a) Clocked filters with finite impulse response (FIR) in the transmitter for predistortion of the signal (cf. U.S. Pat. No. 7,030,657), b) Purely analog time-continuous equalization filters (active Gm-C filters or RC-filters) for elevating the high-frequency signal portions in the receiver (cf. U.S. Pat. No. 6,542,540 and U.S. Pat. No. 7,026,856), c) Time-continuous FIR filters (so-called transversal equalizers) with LC elements or conductor pieces as delay stages in the receiver (cf. U.S. Pat. No. 5,055,795), a) to c) each potentially in combination with a decision feedback equalizer, (DFE) in the receiver, d) Entirely serial sampling FIR filters in the receiver, where a single branch of cascading analog-clocked delay elements passes the scanned symbol values at the clock rate of the sampling period duration from one delay element to the next (cf. U.S. Pat. No. 5,734,680)

e) Entirely parallel sampling FIR filters in the receiver, where for each FIR filter with grade K a total of N equivalent track/hold device and N equivalent addition units are switched parallel at the input, and that require a multiphase clock signal with N individual clock signals with a 1:(N−1) clock ratio (cf. U.S. Pat. No. 6,768,372 and U.S. Pat. No. 6,529,926).

The known methods have various disadvantages:

To a) Adapting the coefficients in the transmitter is difficult because the received signal, and thus the channel properties, are not known in the transmitter or are difficult to obtain.

To b) Active Gm-C filters and active RC filters are too slow for fast data transfer rate applications in a range of several 10 Gbit/sec and have a relatively high electrical power consumption. In addition, their bit rate flexibility is limited and the signal noise is high.

To c) Time-continuous FIR filters in the receiver require sufficient chip area in the receiver due to the integrated spiral inductors (LC filters) or due to the relatively long conductor pieces and are not bit rate flexible. Thus, these filters are designed for a certain bit rate and cannot easily be used for another bit rate.

To d) The cascading chains of the analog-clocked delay elements are too slow for reception and filtering of signals at high baud rates; it is no longer possible to transfer the sampled signal values from one delay stage to the next at the fast clock rate of the incoming data symbols. Furthermore, the non-linear distortions (signal compression), the signal noise and the linear distortions (band limits) of the individual, analog-clocked delay elements will add up such that signal processing with such filters becomes more and more difficult as the degree of filtering (and thus the chain length) increases.

To e) To realize a K order filter, N partial filters must be arranged in parallel. N must be greater than K, most often, N=2*k. Thus, the degree of parallelization is directly coupled to the filter order. If a higher filter order K is required, the order of parallelization N must be increased as well. With a higher-order parallelization N, the clock generation for the parallelized filter must be modified accordingly. Furthermore, generating clock signals with a sampling ratio 1:(N−1) is complex, and it is extremely difficult to guide all N clock signals with a precise time position to the N track/hold devices at a high degree of parallelization N.

Thus, with the state-of-the-art, the realization of an error-free or low-error reception of a fast serial data stream with binary, duo-binary or x-times pulse amplitude modulation, whereby the data stream is transferred via a dispersive, i.e., band width limited channel resulting in distortions presents a significant problem in particular if the reception is to be bit rate flexible. For example, U.S. Pat. No. 6,553,398 (Capofreddi) describes in FIG. 9 a filter structure of the aforementioned kind. This document shows in particular a value-continuous, time-discrete equalizer for filtering a data stream, where several track/hold devices (T/H) that are switched in series form a delay chain. Several such delay chains are arranged in branches that are oriented parallel to each other. This means that this known filter essentially represents a generalized combination of the above filter concepts according to d) (entirely in series) and e) (entirely parallel).

For synchronization reasons, different numbers of track/hold devices are arranged in the individual branches at the beginning of the chains, and for the same reason, the phase spacing of the individual clock signals that are used to control the individual consecutive track/hold devices in the chain is of a different magnitude. Because of the synchronization and starting at a certain location along the N parallel delay chain, the present sampled symbol values are passed on synchronous to a certain individual clock signal of the multiphase clock signal. For this reason, the sampled consecutive symbol values are available at a certain time, i.e., at a certain clock period, simultaneously parallel in the branches for evaluation, for example by a signal addition unit.

However, each track/hold device causes additional non-linear distortions (signal compression), of signal noise and of linear distortions (band limits) added to the actual desired sampled symbol value, which, in the ideal case, should be passed on along the chain without interference. This means that the equalization filter itself adds interferences to the signal, which, in a non-favorable case could influence and falsify the signal decision after the signal addition units.

However, the different number of track/hold devices in the individual delay chains and the different time intervals of the clock signals that are used to control consecutive track/hold devices within a chain result in varying degrees of background noise and on linear and non-linear distortions in the parallel paths. In particular the sampled signal values that are present at equivalent inputs of the signal addition units (that is, to the inputs that are weighted using the same coefficient) are distorted at varying degrees by the background noise and the distortions of the track/hold devices ahead of them. This results in the very unfavorable condition that the transfer properties of the N logic signal paths differ from the input of the filter to the N equivalent inputs of the parallel signal addition units. In the end, the error probability for a symbol received at the input depends on the particular N parallel branch that it is sorted into at the input by the sampling clock signal. This asymmetry with regard to processing of the sampled analog symbol values in the N signal paths is the reason for additional error sources and imperfections that cannot be rectified simply by adjusting the weighting factors or by some other means. Thus, the know equalizer is a parallelized equalizer with an asymmetric structure with regard to the signal paths from the input of the filter to the equivalent inputs of the signal addition units.

It is the objective of the present invention to equalize a serial data stream by means of a bit-rate flexible filter in receivers at the highest data rates with an essentially low power consumption without the use of area- or power-intensive LC stages.

To achieve this objective, it is recommended that, based on the kind stated above the same number of delay elements is arranged consecutively in each of the N branches, clock signals that are provided in various branches for controlling delay elements that correspond to each other with regard to their position in the branches are offset from each other by the duration of one sampling period T (clock phase duration), clock signals that are provided for controlling the signal addition units are offset from each other by the duration of one sampling period T (clock phase duration), clock signals that are provided for controlling consecutive delay elements of a branch are offset from each other by the duration of one half of a clock period duration $T*N/2$, and the signal addition units are connected to the outputs of the delay elements in the branches such that all logic signal paths between the input of the filter structure and the corresponding inputs of the signal addition units that are weighted using the same weighting factor are each guided in the various branches across the same number of delay elements and across delay elements that correspond to each other with regard to their position in the branches.

According to an advantageous advancement of the invention, it is recommended that the clock signals that are provided in consecutive branches for controlling delay elements that correspond to each other with regard to their position in the branches, are offset from each other by the duration of one sampling period T, and that the signal addition units are connected to the outputs of the delay elements in the branches such that all logic signal paths between the input of the filter structure and the corresponding inputs of the signal addition units that are weighted using the same weighting factor are guided in consecutive branches across the same number of delay elements and across corresponding delay elements with regard to their position in the branches, whereby the branch following the last branch of the filter structure is the first branch.

To achieve this objective, it is also recommended, based on the method of the kind mentioned above that the same number of delay elements is arranged consecutively in each of the branches, clock signals that are used in various branches for controlling delay elements that correspond to each other with regard to their position in the branches are offset from each other by the duration of one sampling period T, clock signals that are used for controlling the signal addition units are offset from each other by the duration of one sampling period T, clock signals that are used for controlling consecutive delay elements of a branch are offset from each other by the duration of one half of a clock period ($T*N/2$), and the signal addition units are connected to the outputs of the delay elements in the branches such that all signal paths between the input of the filter structure and the corresponding inputs of the signal addition units that are weighted using the same weighting factor are each guided in the various branches, preferably in consecutive branches, across the same number of delay elements and across delay elements that correspond to each other with regard to their position in the branches.

Advantageous embodiments and designs of the invention are disclosed in the dependent claims.

Thus, to eliminate additional sources of error, all equivalent parallel signal paths in the parallelized structure exhibit the same delay time, and the number and arrangement of the delay elements in the parallel paths is the same and differs only in the control by the subsequent clock phases. The phase distance of the individual clock signals of the multiphase clock signal that control consecutive analog delay elements within a chain are always of the same magnitude.

Analog-clocked delay elements, track/hold devices for example, are used to realize the filter delay elements. Through control using a multiphase clock, the received data stream is split into several parallel, intertwined branches that are fully symmetric to each other, whereby the number N of the phases of the multiphase clock signal is equal to the number N of the parallel branches. FIR filtering of the K-ed order occurs in the individual branches at a 1/N times reduced clock rate or processing speed, respectively. The filter structure according to the invention is designed in particular for filtering distorted binary or duo-binary or x-times pulse amplitude-modulated signals.

With this present invention, a fully symmetric equalization structure with parallel branches of cascading analog delay elements is recommended for the first time, which is controlled by a multiphase clock and where all equivalent signal paths exhibit the same structure. In addition, the structure can be controlled using clock signals with a 1:1 sampling ratio that are easy to generate.

The present invention enables equalization using time-discrete filtering with finite impulse response (FIR filtering) at a very high input data rate R and i-times oversampling with a processing clock rate that is reduced to the frequency $i*R/N$. In addition, less complex area- and power-saving track/hold devices can be employed in the filter structure. The structure according to the invention operates at almost any bit rate due to the control with a specifiable clock signal without the need to change the filter structure such that the bit rate is essentially fully flexible. It is possible to achieve a high input data rate either through high parallelism (many parallel delay branches) or through a high clock rate or processing speed, respectively in the individual branches and in doing so achieve an optimum in the data processing rate, cost and power savings and filter properties.

According to the invention, a serial FIR filter is split into several partial logic parallel filters. The parallelized filter comprises N partial parallel delay chains and N parallel signal addition units. The partial delay chains that are also called delay branches or simply branches each contain at least two delay elements switched in series that are controlled via the multiphase clock with N phases and a period duration $N*T$ (so-called "bucket brigade devices" with a delay time quantum T). The clocked signal addition units access the signals of (in general) several partial delay chains in a suitable manner. Adjacent partial delay chains operate at a time T offset to each other. The respective partial logic filters consist of the respective signal addition unit and those parts of the partial delay chains from which the respective signal addition unit obtains the sampled symbol values. This results in intertwining or interleaving of the partial filters. The topology of the signal addition unit connection to the signals of the partial delay chains exhibits rotational symmetry, i.e., the structure of all partial logic filters is the same, there is a clear order of the partial parallel filter (that is, an order in which the sampled symbol values are read into the partial filters), however, there is no "first" and no "last" partial parallel filter. The first partial filter of the filter structure follows the last partial filter.

According to the example above, the desired filter structure according to the invention is achieved in that every input of every adding unit is connected with outputs of certain delay elements, with the delay elements being arranged in a certain branch and at a certain location within one of the branches. For example, the first input of the first signal addition unit of the filter structure is connected to outputs of certain delay elements of the (first) branch that corresponds to the number of the addition unit, of the previous (last) branch and of the subsequent (second) branch. Used as the delay elements are, for example, the first delay element of the last branch, the second delay element of the first branch and the third delay element of the second branch. In corresponding manner, the first input of the second signal addition unit of the filter structure would then be connected to the outputs of certain delay elements of the (second) branch that correspond to the number of the addition units, of the previous (first) branch and of the subsequent (third) branch, whereby again in a corresponding manner the first delay element from the first branch is used, the second delay element from the second branch and the third delay element from the third branch. In a corresponding manner, all first inputs and all additional inputs of the signal addition units are connected to certain delay elements of certain branches such that the overall result is a symmetric filter structure.

The result is a filter structure, where the selection of the degree of parallelization and of the filter order are independent of each other, i.e., parallelization is required only as much as absolutely needed (based on the speed requirements in the partial delay chains and partial addition units). With the concepts known from the state-of-the-art on the other hand, the degree of parallelization is typically selected to be double the filter order in order to provide sufficient computation time in the signal addition units. The structure according to the invention can be adapted flexibly by adjusting the number of parallel branches and the length of the branches, i.e., the number of the track/hold devices per branch optimally to the clock rate, the signal quality and the available quality of the electronic components (according to cost and size). On the other hand, due to its fully symmetrical design, the structure is able to ensure a consistent signal quality in each branch and in each signal processing phase. One important aspect of the invention is to reduce the clock rate required for signal processing in the individual branches after splitting the data stream into several branches and thus to allow for overall higher clock rates for the actual signal transfer.

Following, particular advantages and preferred embodiments of the filter structure according to the invention will be described in greater detail with reference to the figures, of which FIG. 1 shows a block diagram of a filter structure according to the invention with four parallel branches;

Figure 1:
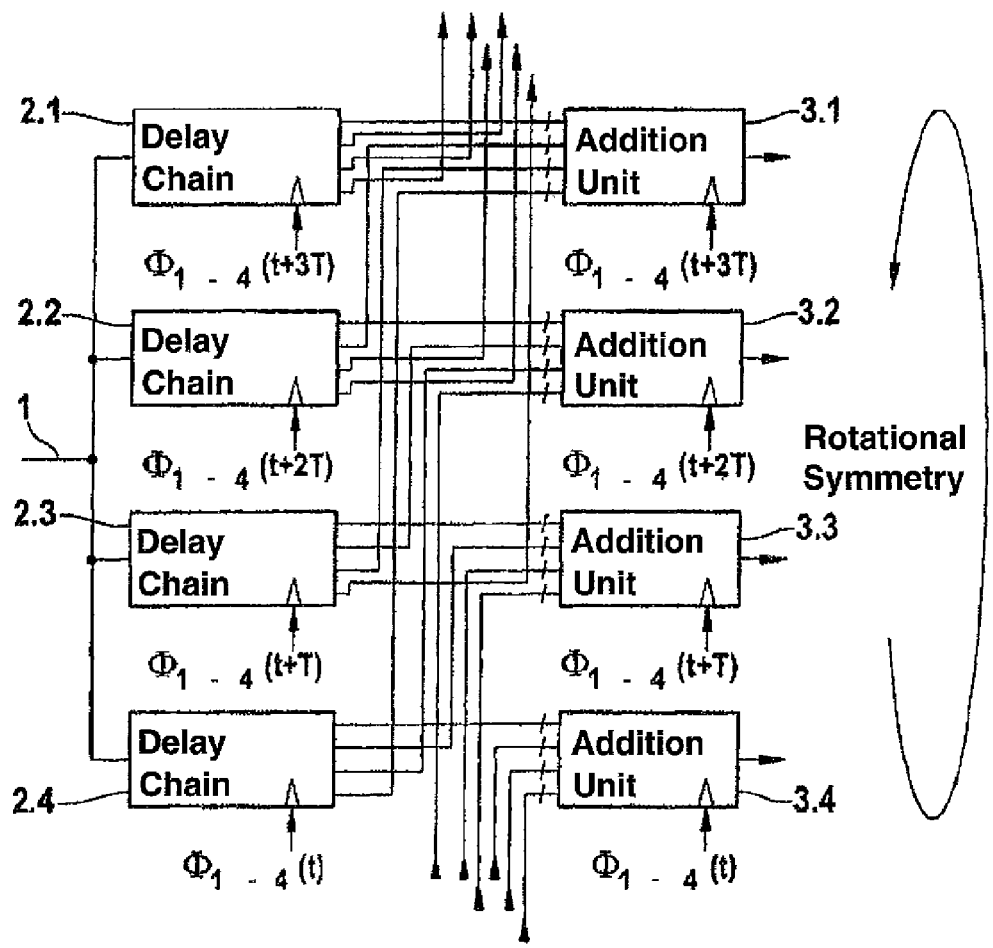

Base band data transfer via electronic pc boards (PCB), for example in back panel PCB busses for switching computers or mainframe computers, or via the memory bus in personal computers can reach transfer rates of several Gbit/s per channel. In fiber optics networks, (LANs, local area Networks; MANs, metropolitan area networks; WANs, wide area networks) the data transfer rate reaches several 10 Gbit/s. However, both the electrical transfer via conductors on standard PCB substrates and the optical transfer via fiber optics suffer from dispersion, losses and reflections. A simple binary transfer (with a binary transmitter and a binary receiver) fails due to inter symbol interferences (ISI) between consecutive data symbols if it is used beyond a certain transfer distance or beyond a certain symbol rate. This becomes apparent when viewing the signal in a so-called closed eye diagram.

Intentional predistortion of the signal to be transmitted in the transmitter (transmitter pre-distortion) and postdistortion or equalization in the receiver (receiver equalization) are methods for mitigating the weakness of the transmitter channel. One known method is the use of a filter with finite impulse response (FIR) in the transmitter and a decision feedback equalizer (DFE) in the receiver. Additional time-continuous amplifiers for raising the high-frequency signal portions (so-called peaking amplifiers) in the receiver are used as well. Disadvantages of predistortion are the required knowledge on the transmitter side regarding the channel properties as well as an increasing high frequency signal power at the transmitter that may inject into other channels. Electronic equalizers for optical systems often use relatively long FIR filters that operate at the full symbol rate for postdistortion in the receiver that are typically implemented using power- and area-intensive LC delay circuits (full-rate buffered LC-delay lines).

According to the present invention, a filter structure is introduced for an equalizer, where conventional track/hold devices are used as the FIR filter delay elements. Neither chip area intensive LC delay elements nor transfer line delays nor any other time-continuous analog delay elements are needed in the concept according to the invention. The delay of the output signal versus the input signal of the track/hold devices is defined by the data-synchronous multiphase clock signal such that the filter structure according to the invention is bit rate flexible. The present invention relates to an FIR filter for filtering a data stream of a fast serial data transfer. The data stream may be transferred via copper lines or optical fibers. A possible field of applications for such a filter is, for example, the data transfer between a processor and a memory or a memory controller and the memory of a data processing system, for example a computer. The data transfer rate can be increased by increasing the number of parallel conductors. Currently, data transfer between processor and memory typically occurs via a data bus with 64 parallel lines, i.e., a 64 bit wide parallel bus. Additional widening of the data bus, for example to 128 or more bits has limits due the space requirements on the printed circuit board. For this reason, an additional data rate increase across the entire memory from currently about 64 Gbit/s (64*1 Gbit/s, corresponds to a total of 8 Gbyte/s) at a 64 Bit wide data bus to, for example 320 Gbit/s (40 Gbyte/s) or even 640 Gbit/s (80 Gbyte/s) cannot be achieved simply by widening the data bus.

An increase in the symbol rate at the individual lines in order to transfer several 1 Gbit/s per line is also not readily possible. This is because an increase in the symbol rate leads to an additional deterioration of the transferred signal such that it can only be detected poorly at the receiver or not at all. In particular, an increase in the data transfer rate has the tendency to widen and flatten the individual data symbols such that, for example, an impulse response is no longer received as a short impulse with steep edges and a relatively high amplitude but rather as a flattened slowly rising oscillation that also falls slowly from its maximum value.

In data transfer between the memory controller and the memory in a computer, i.e., at a data transfer via memory busses, an error rate of zero is expected. In the field of telecommunications, another potential area of application for the filter structure according to the invention, low error rates, for example in the 1 per mille range, can be accepted due to the use of suitable error detection and error correction algorithms.

To improve the quality of a transferred signal, various types of filters are used in the state-of-the-art. Examples for such known filters are described in U.S. Pat. No. 6,768,372 B2, as well as in U.S. Pat. No. 6,553,398 B2. The filters are to dampen the signal portions with low amplitudes and enhance the signal portions with high amplitudes such that the signal received by the receiver can be detected, for example using a simple decision device that checks if a threshold was exceeded or not.

According to the invention, a filter structure for filtering an analog input signal with a certain symbol rate R is recommended. FIG. 1 shows a block diagram of a filter structure according to the invention with four parallel branches (N=4). The filter structure comprises an input 1 where the input signal is applied with a certain symbol rate (1/R is the duration of a single data symbol). The filter structure comprises several parallel branches, each exhibiting a delay chain 2, and several signal addition units 3. The exemplary embodiment shown in FIG. 1 comprises the filter structure according to the invention of four such parallel branches and four addition units 3. Of course, a filter structure with only two or with eight parallel branches or addition units 3, respectively, is conceivable as well. Preferably, the filter structure comprises $2^j$ parallel branches with j being a natural positive number except for 0. Of course, the filter structure may also exhibit 6, 10 or any other desired even number of branches and addition units 3.

Figure 9:
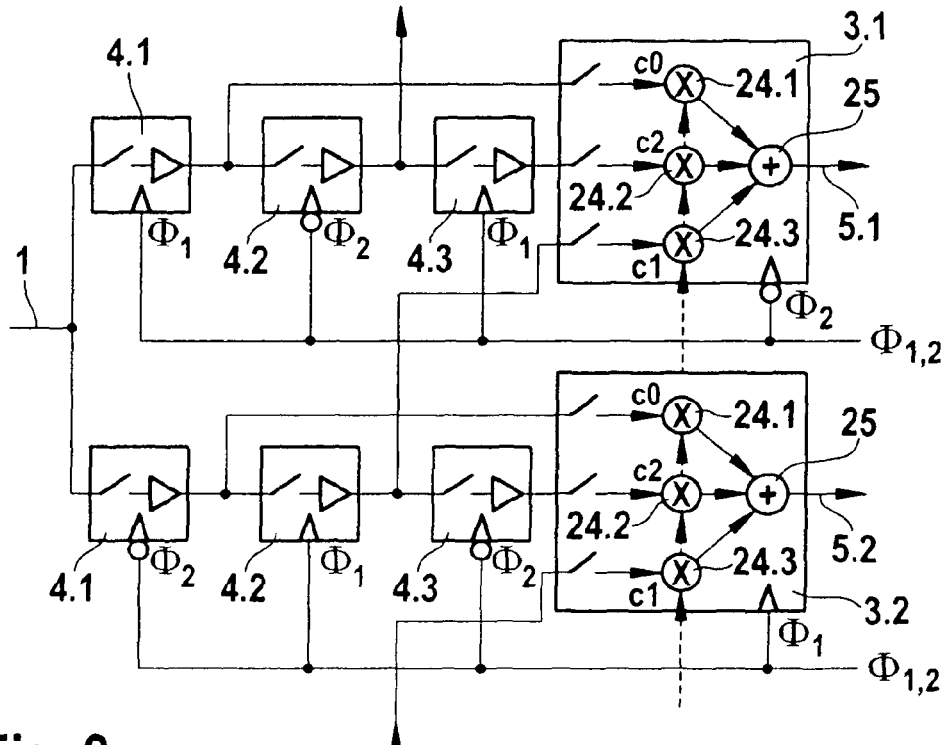
FIG. 9 shows a block diagram of a filter structure according to a preferred embodiment a 2-times parallel FIR equalizer with a 2-phase clock rate.
Figure 14:
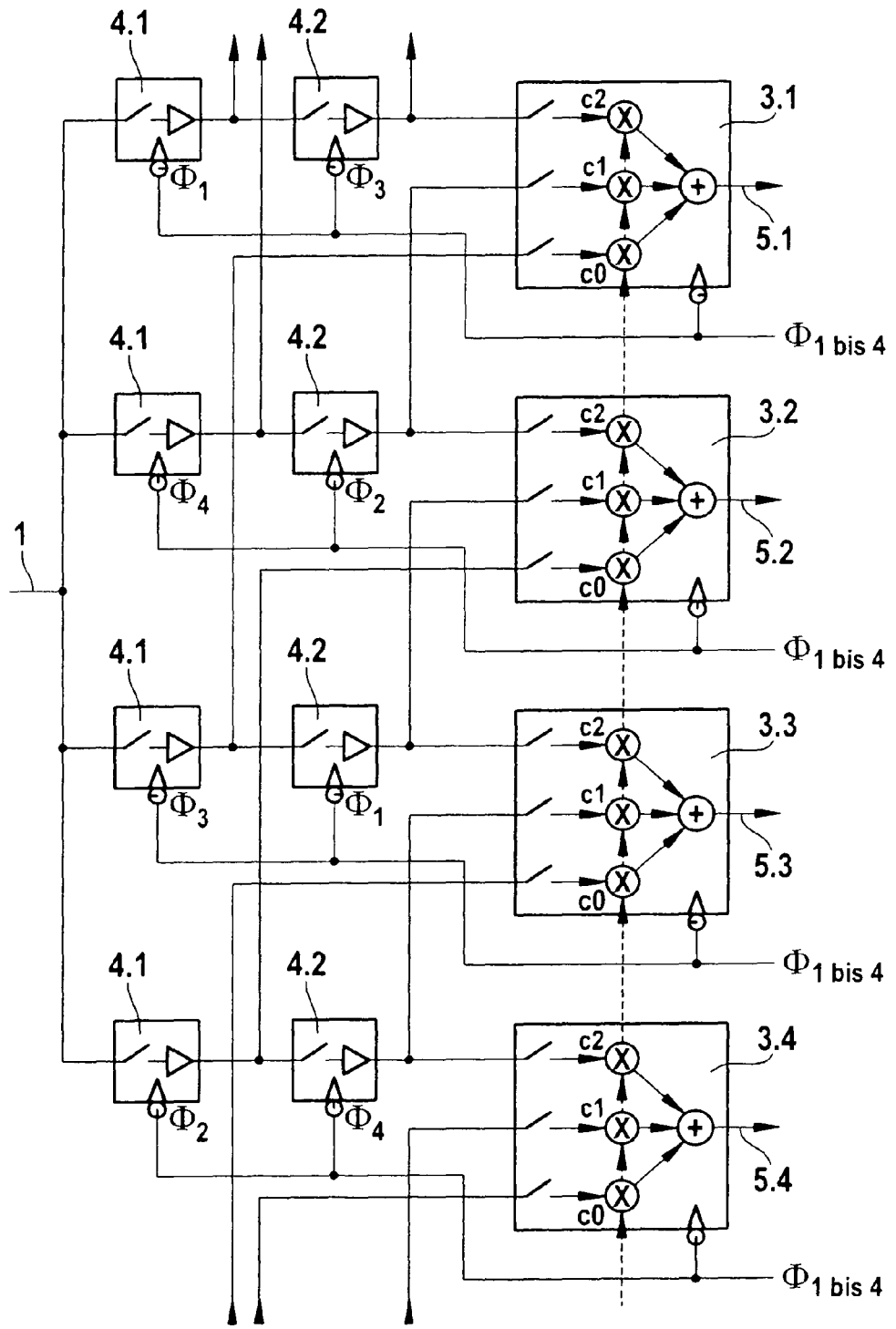
FIG. 14 shows a block diagram of a filter structure according to a preferred embodiment as a 4-times parallel FIR equalizer with a 4-phase clock rate.

Each addition unit 3 can be connected to outputs of the delay elements within a delay chain 2 via one or several signal paths. This potentially multiple connection between a certain addition unit 3 and a certain delay chain 2 is shown in FIG. 1 as a line. Each addition unit 3 can be connected to one, to several or to all delay chains 2. Important in this regard is the rotation-symmetric arrangement of the connections. For example, if the top addition unit 3.1 is connected to the first delay unit 4.1 and to the last delay unit 4.3 in the second delay chain 2.2, counting from the top, then the second from the top addition unit 3.2 must be connected to the first delay unit 4.1 and the third delay unit 4.3 in the third delay chain 2.3, and the third from the top addition unit 3.3 must be connected to the first delay unit 4.1 and the third delay unit 4.3 in the fourth delay chain 2.4, and the fourth from the top addition unit 3.4 must be connected to the first delay unit 4.1 and the third delay unit 4.3 in the top delay chain 2.1. Generally expressed this means that the i-th addition unit 3.*i* is connected to the first delay unit 4.1 and the third delay unit 4.3 in the (i+1)-th delay chain 2.(*i*+1). FIGS. 9 and 14, which will be explained in greater detail below, show this symmetry in an accordingly adapted manner, for example.

The filter properties of the filter structure can be altered in a wide range and adapted to the actual channel properties by varying the filter coefficients at the inputs of the addition units 3 for weighting the applied input signals.

Not all connection paths between the delay chains 2 and the addition units 3 shown in FIG. 1 need to be used. It is also conceivable, for example, that the addition unit 3.1 is connected only to the delay chains 2.1, 2.2 and 2.3. In a corresponding manner, the remaining addition units 3.2, 3.3, 3.4 would then be connected to only three of the delay chains 2 as well. In particular, the addition unit 3.2 would be connected to the delay chains 2.2, 2.3 and 2.4, the addition unit 3.3 to the delay chains 2.3, 2.4 and 2.1 and finally, the addition unit 3.4 to the delay chains 2.4, 2.1 and 2.2. Thus, the clocked signal addition units 3 access signals of several delay chains 2, such that one can say that the individual partial filters in the branches of the filter structure are intertwined or interleaved. The topology of the signal addition unit 3 connection to the signals of the delay chains 2 exhibits rotational symmetry, i.e., the structure of all partial logic filters in the branches of the filter structure is the same, there is an order of the partial parallel filters, however, there is no "first" and no "last" partial parallel filter.

The result according to the invention is a filter structure, where the selections of the degree of parallelization, i.e., the number of parallel branches, and of the degree of filtering, i.e., the number of inputs or filter coefficients of the addition units 3 are made independent of each other. The fundamental objective of the filter structure according to the invention is to reduce the clock rate required for signal processing in the individual paths or branches of the filter structure, respectively, by splitting the data stream into several branches and thus to allow for overall higher clock rates for the actual signal transfer. The parallel branches of the filter structure reduce the processing speed in the individual filter branches. Thus, parallelization is required only as much as absolutely needed based on the speed requirements in the delay chains 2 and the addition units 3.

The clock signals $\phi_{1-4}$ for controlling the delay chains 2 and the addition units 3 in the individual branches are offset from each other by one time period T each. T corresponds to the duration of the sampling period, i.e., the time interval of the extraction of sampled signal values from the input signal through the filter structure, $T=1/(i*R)$, where i is the degree of oversampling of the input signal. The multiphase clock signal $\phi_{1-4}$ has as many (N) phases as the number of parallel branches provided in the filter structure, i.e., four phases (N=4) in the example of FIG. 1. N corresponds to the degree of the filter's parallelization, i.e., the number of the parallel delay chains 2 and the number of the clock signals $\phi_1$, $\phi_2$, $\phi_3$, $\phi_4$ that are offset from each other in the multiphase clock signal $\phi_{1-4}$. The phases are offset from each other by a duration T corresponding to an i-th of the symbol duration 1R ($T=1/(i*R)$). The clock signal $\phi_{1-4}$ has a frequency $f_{takt}$ corresponding to i times the symbol rate R divided by the number of parallel branches ($f_{takt}=i*R/4$). i is a natural positive number except for zero.

Figure 2:
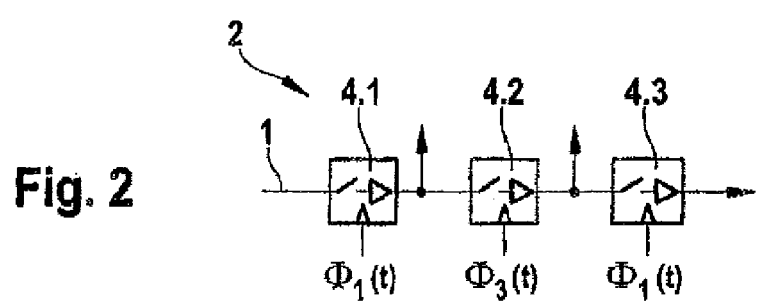
FIG. 2 shows an example of a partial delay chain of a filter structure according to the invention with three track/hold devices switched in series.

The delay chains 2 each exhibit at least two track/hold devices switched in series that are controlled via the multiphase clock $\phi_{1-4}$. FIG. 2 shows one example for such a delay chain 2 with three serial track/hold devices 4. According to the invention, each branch of the filter structure has the same number of consecutive track/hold devices 4 arranged in them. Furthermore, the phase distance of the clock signals that control consecutive track/hold devices 4 are always of the same magnitude.

Figure 3:
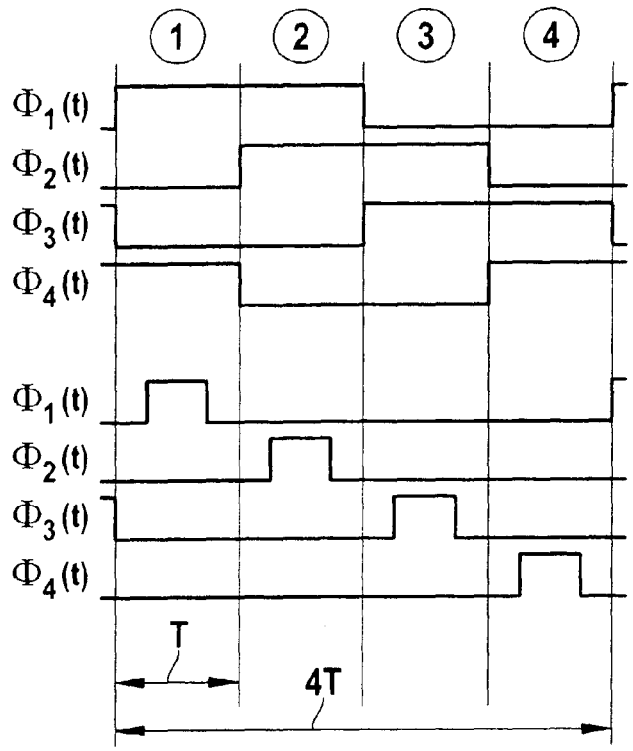
FIG. 3 shows examples of possible multiphase clock signals for controlling the track/hold devices of a filter structure according to the invention.

FIG. 3 shows examples of possible clock signals $\phi_1(t)$ to $\phi_4(t)$ for controlling the track/hold devices 4 of the various parallel branches of the filter structure according to the invention. The period duration of the clock signal is designated with N*T and corresponds to the time interval of the extraction of sampling values from the input signal by the same delay chain 2. $1/(N*T)$ corresponds to the frequency of the multiphase clock signal $\phi_{1-4}$. Consecutive clock signal phases are offset from each other by the duration T. The individual clock phases are designated with the numbers 1 to 4 in a circle.

Figure 4:
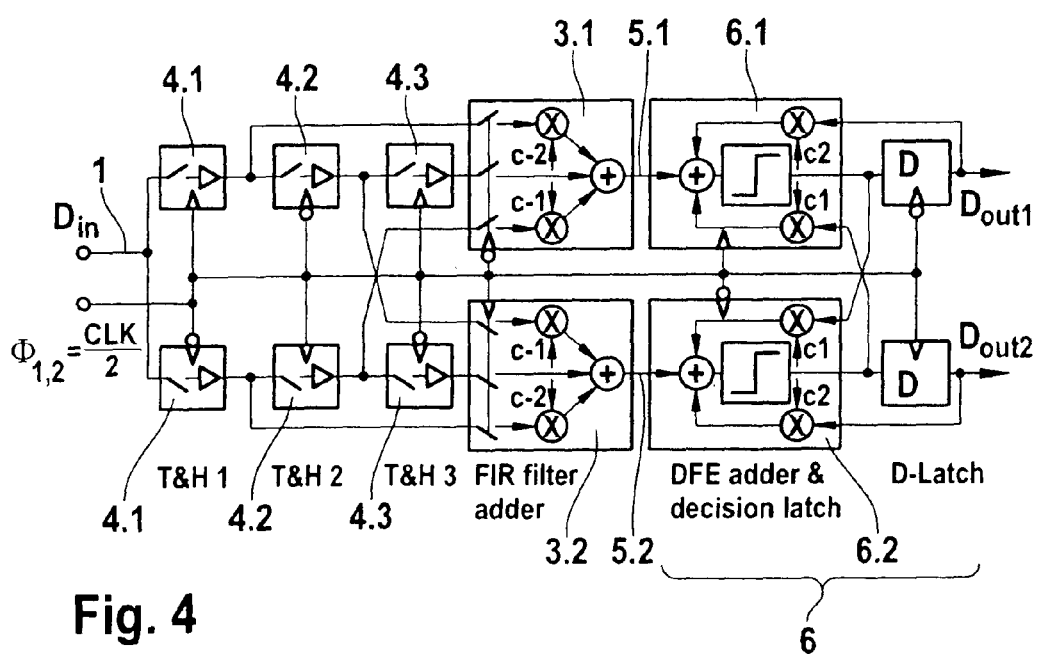
FIG. 4 shows an example of a realization of a filter structure according to the invention, where the track/hold devices are controlled by a clock signal with a frequency corresponding to half of the symbol rate R.

FIG. 4 shows another example of a realization of a filter structure according to the invention followed by a decision feedback equalizer (DFE), where the track/hold devices 4 are controlled by a clock signal with a frequency corresponding to half of the symbol rate R of the input signal applied to input 1 (oversampling factor i=1). The filter structure of FIG. 4 comprises two parallel branches, where the input signal $D_{in}$ is present. Each of the branches comprises three track/hold (T&H) devices 4 switched in series. Additionally, the filter structure also comprises two signal addition units 3 (FIR filter adders). The addition units 3 each exhibit three inputs with the upper addition unit 3.1 being connected to the output of the first and third track/hold device 4.1, 4.3 of the upper branch and the output of the second track/hold device 4.2 of the second branch and the lower addition unit 3.2 to the outputs of the first and third track/hold device 4.1, 4.3 of the lower branch as well as with the output of the second track/hold device 4.2 of the upper branch.

Preferably, the filter structure according to the invention is arranged at the end of a data transfer line. The channel properties are determined using an essentially known method of measuring the received signals such that the filter function can be optimized using essentially also known optimization algorithms.

The filter structure according to the invention can terminate after the addition units 3. Simple decision devices can be connected directly to outputs 5 of the addition units 3 to check if the output signal present at output 5 is above or below specifiable thresholds. Alternatively, it is also conceivable that the filter structure exhibits a decision feedback equalizers, (DFE) 6 as well that it is connected to the outputs of the addition units 3. In FIG. 4, the equalizer 6 is designed as a 2 times parallelized DFE. The equalizer 6 comprises two adders 6.1, 6.2, each with an integrated decision device. The combination shown in FIG. 4 of an FIR filter according to the invention with 2 times parallelization with a decision feedback equalizer 6 that operates in push-pull mode (i.e., 2 times parallelized as well) presents a particularly advantageous embodiment in the receiver.

A concept known from the state-of-the art that operates with the full clock rate (i.e., non-parallelized FIR filters) requires at least two cascading track/hold devices 4 in a master/slave configuration in order to implement a simple uniform equalization T, where only 50% of the time T is available for tracking, the other 50% is used for holding. Thus, six cascading track/hold devices 4 are required for an FIR filter structure with three serial uniform equalizations T. The bandwidth of the track/hold devices 4 in the branches is limited both by the bandwidth of the sampling switch at the input as well as by the bandwidth of the capacitive output that requires load switching. Thus, the entire cascading bandwidth of a six-stage track/hold device chain is too small, for example for a 10 Gbit/s data transfer in 0.13 µm CMOS technology.

A filter structure as presented in FIG. 4 is, therefore, recommended that operates at half of the clock rate. Two interacting and interleaved FIR filter branches operate in a push-pull mode and are controlled by a clock signal CLK/2 with half the clock rate ($f_{takt}$=R/2). The advantage with regard to the bandwidth of the concept operating at half of the clock rate is that the change length of the track/hold device 4 can be halved in the delay chains and that now the entire uniform delay time T is available for tracking. This relieves the bandwidth problem of the cascading track/hold devices 4 by a factor of 4 and the problem of noise adding up and non-linear distortions adding up across the delay chains by a factor of 2.

For the successful realization of the invention, it is necessary that the two branches be designed in the same manner, which can be realized through a symmetrical design of the circuit. In contrast to the FIR filter structures known from the state-of-the-art, the degree of parallelization of the filter according to the invention can be reduced drastically and is independent of the FIR filter degree. This means that the degree of parallelization can be selected significantly smaller than the filtering degree. Thus, the concept according to the invention allows for the realization of significant savings concerning the required chip area and the power consumption.

Figure 5:
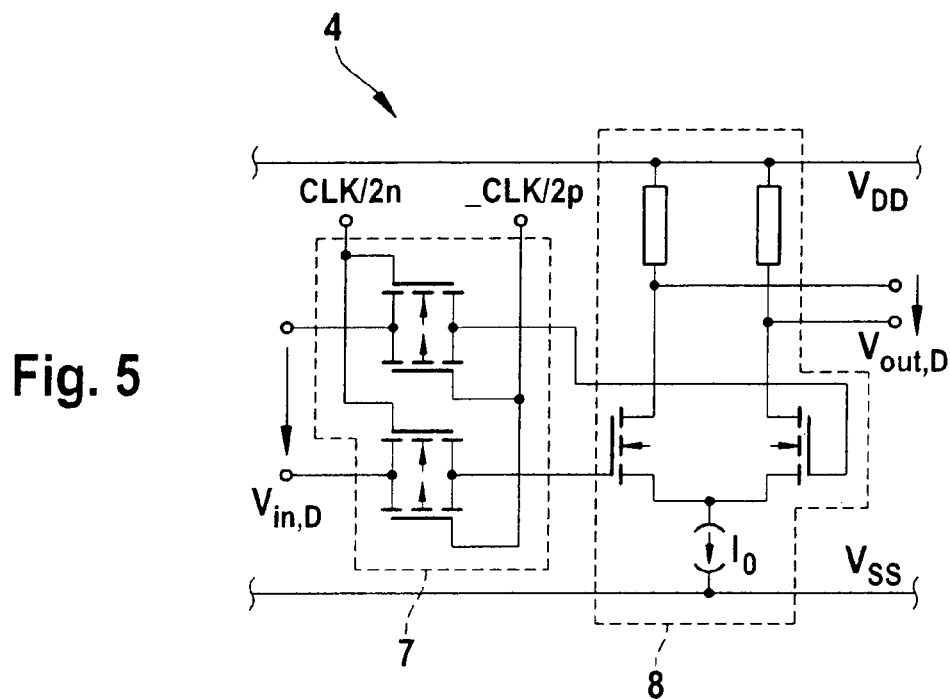
FIG. 5 shows a circuit diagram of a track/hold device.

FIG. 5 shows in detail an example for a circuit of a track/hold device 4 as used in the filter structure according to the invention. The circuit is a combination of a differential complementary CMOS passgate 7 with a buffer amplifier 8 with an amplification factor of 1. The hold capacity is comprised of the parasitic capacity at the input of the buffer amplifier 8 and the parasitic capacity on the hold side of the passgate. The clock signal CLK/2$n$ for the n-channel transfer MOSFET is raised because the common mode level of the input voltage $V_{in,D}$ is only about 300 mV below the positive supply voltage $V_{DD}$. To ensure the symmetry of the clock signal paths for the n-channel and the p-channel MOSFET in the pass-gate 7, the clock signal CLK/2$p$ is raised for the p-channel pass transistor as well.

Figure 6:
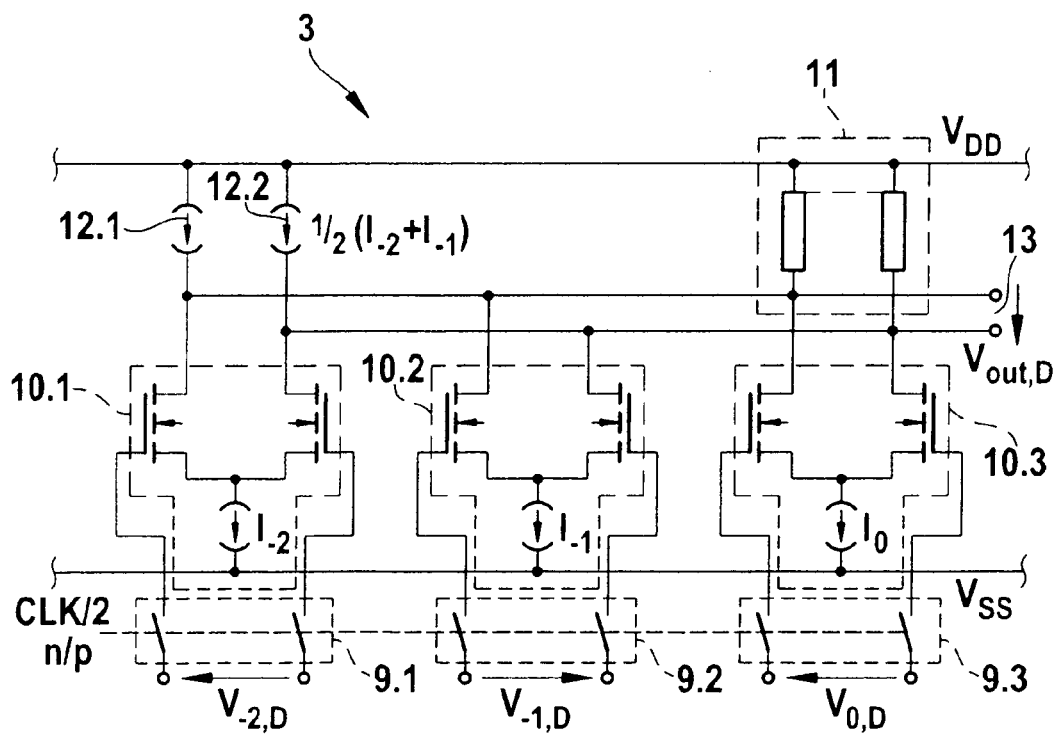
FIG. 6 shows an example for a clocked signal addition unit for an equalizer with a finite impulse response (FIR)

FIG. 6 shows an example of an addition unit 3 used for a filter structure according to the invention. The addition unit 3 comprises three differential passgates 9.1, 9.2, 9.3 that are connected to differential transconductors 10.1, 10.2, 10.3 that add their output currents to one common pair of load resistors. A transconductor is a voltage to current converter according to the equation $i_{out}=G_m*v_{in}$, where $G_m$ is the amplification factor of the transconductor.

The algebraic signs of the weighting factors of the FIR filter are fixed wired by the polarity of the connectors of the transconductors 10.1, 10.2, 10.3 because, depending on the length of the conductors on the PCB and the data rate, only the magnitude and not the algebraic sign of the optimal weighting factors of the FIR filter change. The maximum values of the weighting factors are set by dimensioning the respective transistor width in the transconductors 10.1, 10.2, 10.3. The weighting factors are adjusted by controlling the currents $I_1$ and $I_2$ using control currents that are applied externally. Half of the sum of the currents $I_1$ and $I_2$ is applied to every output node through p-channel MOSFETs 12.1, 12.2 in order to ensure a consistent direct current level at output 13. This is of particular importance for the input of the subsequent decision feedback filter 6 and prevents a degeneration of the differential pairwise transconductors at large weighting factors.

Figure 7:
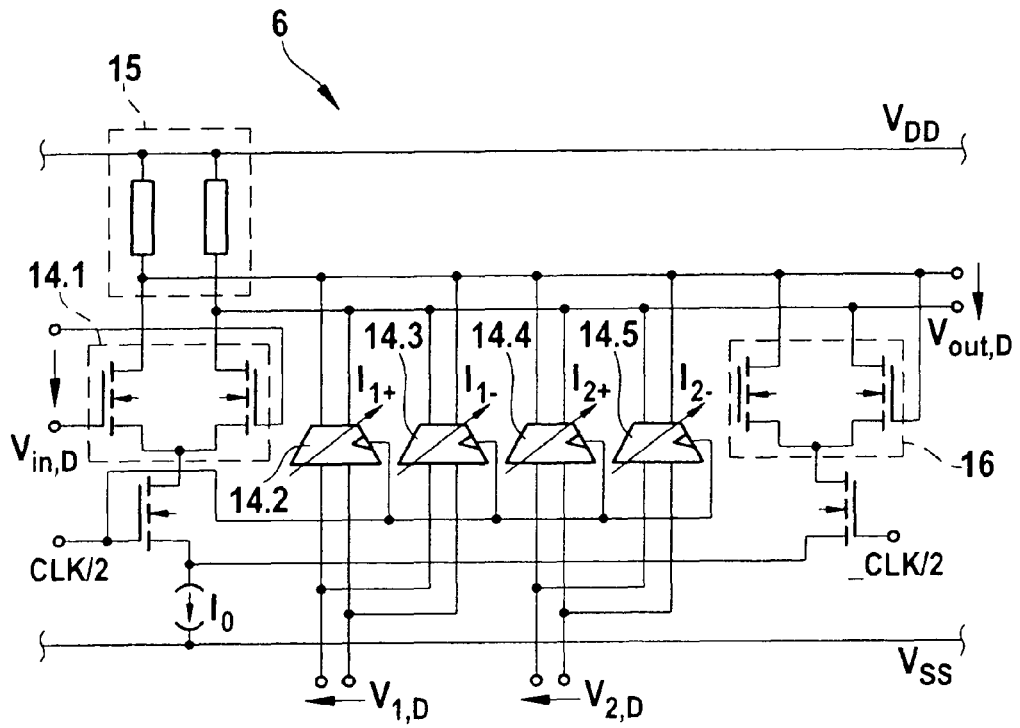
FIG. 7 shows a circuit diagram of an addition device for a decision feedback equalizer with integrated decision device.

FIG. 7 presents a block diagram of an adder with an integrated decision device for the decision feedback filter 6. The adder for the decision feedback equalization is realized similar to the adder for the FIR filter through several parallel differential transconductors 14.1 to 14.5, which add their output currents together to a common pair of load resistors 15. However, contrary to the adder for the FIR filter, the transconductors 14.1 to 14.5 are clocked. Also integrated in the adder is a clocked decision latch 16. The input voltage $V_{in,D}$ is fed to the clocked tracking transconductor 14.1, and the decision is made by a clocked decision device 16. During tracking, the feedback signals are added up via adaptable differential transconductors 14.2 to 14.5. Two transconductors 14.2 and 14.4 are connected for a positive algebraic feedback sign and two transconductors 14.3 and 14.5 for a negative one. The respective algebraic sign is selected by applying the control currents to the respective inputs $I_{1+}$, $I_{1-}$, $I_{2+}$, $I_{2-}$ for the decision feedback filter 16.

Figure 8:
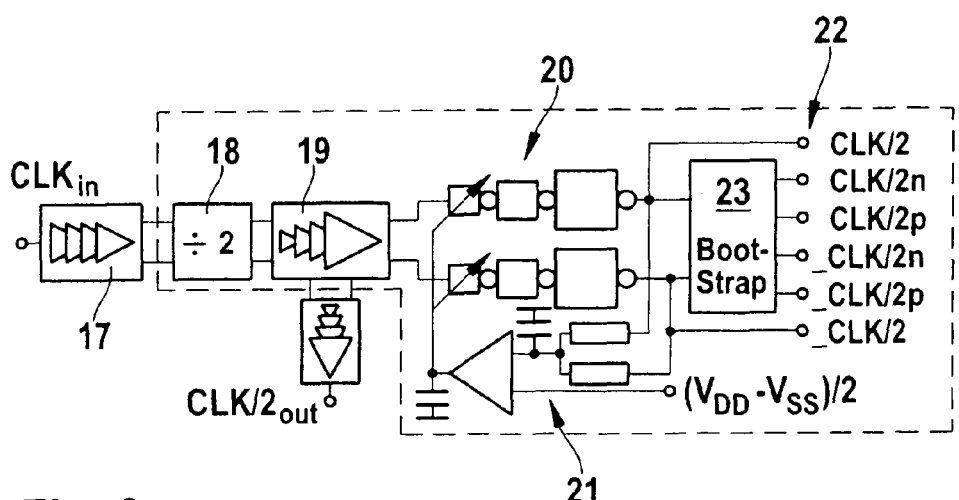
FIG. 8 shows an example of a block diagram of a clock generator for controlling the filter structure according to the invention.

FIG. 8 presents a block diagram for a clock generator that generates a multiphase clock signal for controlling the filter circuit according to the invention. This multiphase clock signal is fed to the filter circuit or the delay devices and the addition units. Six individual clock paths that oscillate at half of the frequency of the sampling frequency effective at the input are shown in the circuit in an exemplary fashion. The decision feedback equalizer (DFE) operates with one complementary pair of fully controlled CMOS clock signals (CLK/2 and _CLK/2). The track/hold devices of the delay chains 2 and the addition units 3 of the FIR filter according to the invention require complementary pairs of raised nearly fully oscillating clock signals both for the n-channel MOSFETs (CLK/2$n$ and _CLK/2$n$) and for the p-channel MOSFETs (CLK/2$p$ and _CLK/2$p$) of the pass-gates.

The clock generator circuit comprises an externally present clock signal $CLK_{in}$ of a full clock rate (at the frequency i*R). It is initially amplified by a differential input clock driver chain 17 and converted to a differential signal. The differential clock signal is then divided by two using a clock divider 18. The divided clock signal is fed to a differential driver chain 19 with an increasing driver force and then amplified further with an increasing driver force using two CMOS inverter chains 20. The first CMOS inverter decision threshold is controlled by a feedback loop 21 in order to ensure a clock ratio of 50% at the outputs 22 of the clock generator. The complementary and raised clock signals are generated by passive bootstrap circuits 23 that include capacities and small clocked MOSFETs. The common mode level of the raised clock signals are preset in the circuit, however, it is also possible to set them using external control voltages.

FIG. 9 shows an additional exemplary embodiment of the filter structure according to the invention. The structure in FIG. 9 corresponds to the first part of the combined FIR and DFE filter of FIG. 4. The filter structure according to this embodiment comprises two parallel filter branches each with three track/hold devices 4.1, 4.2 and 4.3 switched in series. In addition, the filter structure comprises two addition units 3.1 and 3.2 each with three inputs. The inputs of the first addition unit 3.1 are connected to the outputs of the first and the third track/hold device 4.1 and 4.3 of the upper branch and to the output of the second track/hold device 4.2 of the lower branch. The second addition unit 3.2 is connected to the outputs of the first and third track/hold device 4.1 and 4.3 of the second branch and to the output of the second track/hold device 4.2 of the upper branch. The signals applied to the inputs of the addition units 3.1 and 3.2 are multiplied with weighting factors c0, c1, c2 at multiplication locations 24.1, 24.2 and 24.3 in the addition units 3.1 and 3.2. At least one of the weighting factors can be set to equal 1 such that not all weighting factors, preferably only two of the weighting factors, need to be set. The possibility of the variation of the weighting factors is illustrated by the dashed arrows towards the multiplication locations 24.1, 24.2 and 24.3. A summation point 25 is provided in each of the addition units 3.1 and 3.2, where the outputs of the multiplication points 24.1, 24.2 and 24.3 converge and where the output signals of the multiplication points 24.1, 24.2 and 24.3 are added up. Thus, the sums of the output signals of selected track/hold devices 4 of the upper and lower branch weighted with the filter coefficients are present at outputs 5.1 and 5.2 of the addition units 3.1 and 3.2.

The weighting factors c0, c1, c2 can be adjusted either only at the beginning of the operation of the filter structure according to the invention or also during the filter's entire time of operation. The embodiment with filter coefficients that can be adjusted during operation is of particular interest for applications of the filter according to the invention in the field of telecommunications, where changes in the transmission properties can occur due to changing conditions of the transfer path and/or the channel properties and where such changes can be compensated for by adjusting or adapting the filter coefficients.

The track/hold devices 4 and the addition units 3 are controlled using a multiphase clock signal $\phi_{1,2}$. In the exemplary embodiment of FIG. 9 with two parallel branches, the clock signal exhibits two phases. While the clock signal $\phi_1$ is applied to the first and third track/hold device 4.1 and 4.3 of the upper branch and to the track/hold device 4.2 of the lower branch, as well as at the second addition device 3.2, the phase-shifted, clock signal $\phi_2$ is present at the exemplary embodiment inverted with only two branches to the second track/hold devices 4.1 and 4.3 of the lower branch, as well as the first addition unit 3.1.

Below, the operation of the filter structure from FIG. 9 at various consecutive clock phases is described in greater detail using FIGS. 10 to 13. Each of the track/hold devices 4 that is at the respective time in the hold phase as well as the addition unit 3 that follows the signal applied to its input is shown in FIGS. 10 to 13 with a thicker line and is additionally designated with "H" than those track/hold devices 4 that are in the track phase (and are additionally designated with "F") and that addition unit 3 that holds the signal values applied to its input. Thus, those track/hold devices 4 are bordered by thick lines that supply the signals at their outputs for the addition units 3 that are in the respective clock phase in the track mode. In addition, the addition units 3 that are in track mode are framed with thick lines.

Any data symbol sequence with the symbol rate R=1/T is applied as the input signal at input 1 of the filter structure according to the invention. The order of arrival of the symbols at input 1 is identified clearly with the numbers "0, 1, 2, 3, 4" in FIGS. 10 to 13 in order to make apparent the handoff of the sampled symbol values in the delay chains or the analog delay elements 4, respectively and the addition units 3. Sampled symbol values that have already been sampled at previous sampling times ("−3, −2, −1") are still present at the output of one of the track/hold devices 4. For simplicity sake, i=1 is assumed, i.e., each arriving data symbol is sampled exactly one time.

Figure 10:
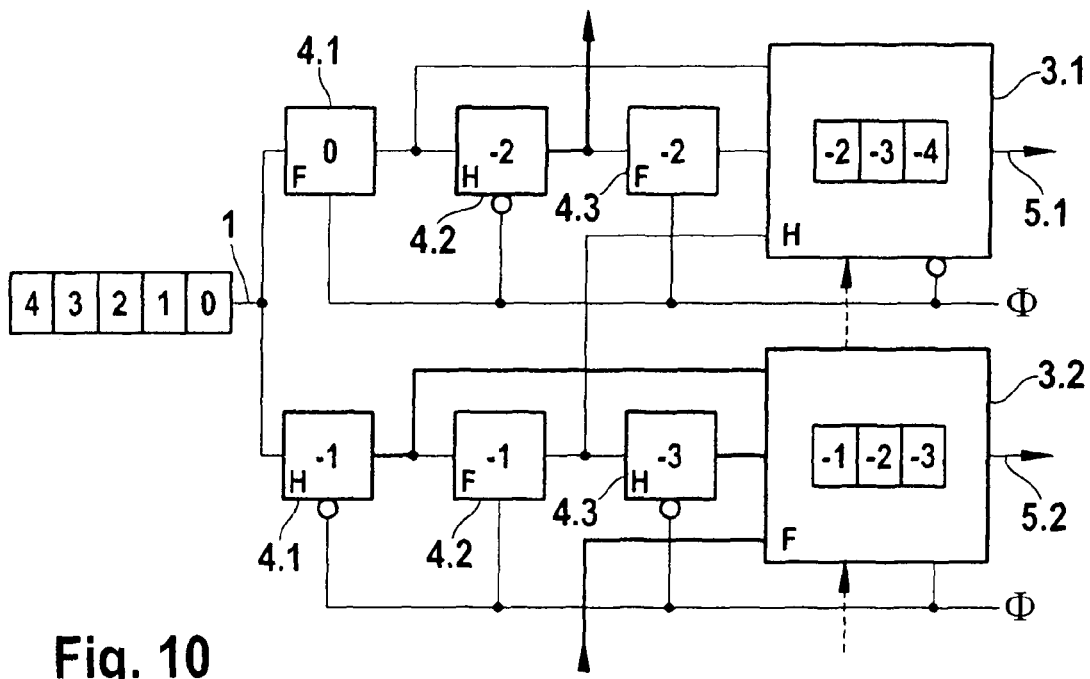
FIG. 10 shows a first switching state of the filter structure of FIG. 9.

During the clock phase shown in FIG. 10, the first track/hold device 4.1 of the lower branch is in the hold phase. This means that it retains the symbol value with the number "−1" from the previous clock phase. The second track/hold device 4.2 of the lower branch is in the track phase and assumes the symbol value with the number "−1" from the previously connected track/hold device 4.1. The last track/hold device 4.3 of the lower branch is again in the hold phase and retains the symbol value with the number "−3". The first track/hold device 4.1 of the upper branch is in the track phase. This means that it tracks the input signal present at input 1. For this reason, the first symbol value with the number "0" present at input 1 is assumed in the first track/hold device 4.1 of the upper branch. The second track/hold device 4.2 of the upper branch is in the hold phase and retains the symbol value with the number "−2". The third track/hold device 4.3 of the upper branch is again in the track phase and assumes the symbol value with the number "−2" from the second track/hold device 4.2.

The second addition unit 3.2 takes the signal values ("−1, −2, −3") that are present at the output of the track/hold devices 4 which are in the hold phase and processes them (weighting and summation). The second addition unit 3.2 is thus in its track phase such that in the clock phase shown in FIG. 10 it outputs at its output 5.2 a new signal value compared to the previous clock phase. At the same time, the first addition unit 3.1 is in its hold phase such that the same output signal as in the clock phase immediately before is present at its output 5.1.

In the directly following clock phase (cf. FIG. 11), the first track/hold device 4.1 of the upper branch is now in the hold phase such that the symbol value present at the previous clock time ("0") continues to be present at output 5.1. The first track/hold device 4.1 of the lower branch is now in the track phase, i.e., it can follow the signal value present at input 1. The next symbol value present ("1") is thus transferred to the first track/hold device 4.1 of the lower branch. The track/hold devices 4 that in the previous clock phase (cf. FIG. 10) have been in the hold mode are taken to the track mode by the clock signal $\phi$. Through this clock control, the output signals of the track/hold devices 4 in the delay chains 2 are shifted to the right by one track/hold device 4 in comparison to the previous clock phase (FIG. 10).

Figure 11:
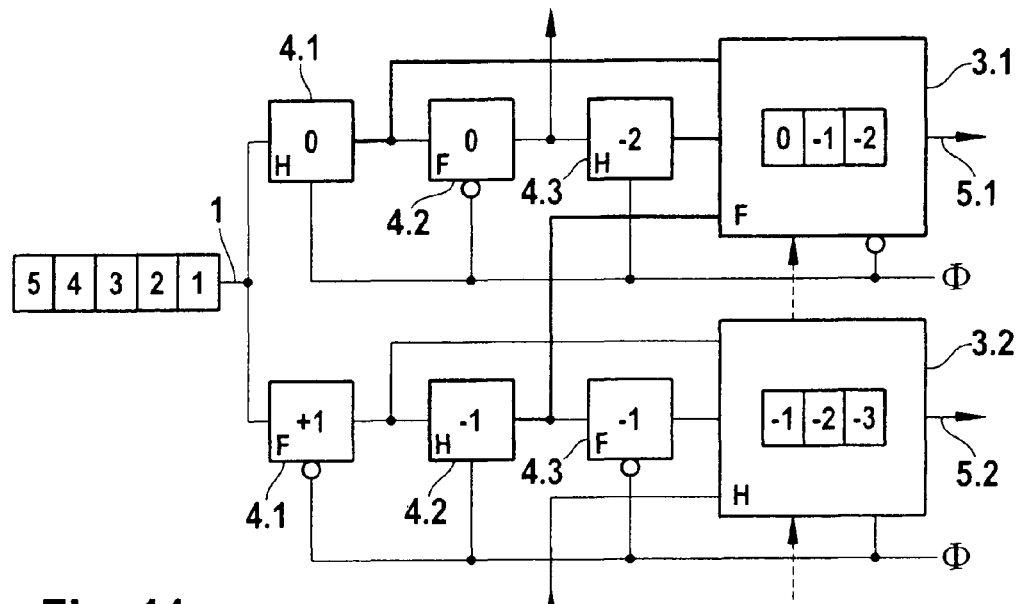
FIG. 11 shows a second switching state of the filter structure of FIG. 9.

The second addition unit 3.2 is now in the hold state and retains the signal value ("−1, −2, −3") from the previous clock phase during the clock phase shown in FIG. 11 as well. The first addition unit 3.1, on the other hand, is in the track state. The output signals of track/hold devices 4 that are now in the hold phase (identified by thicker lines) are applied to the first addition unit's 3.1 inputs, and the first addition unit 3.1 reads in respective symbol values ("0, −1, −2"). The signal present at the output 5.2 of the second addition unit 3.2 from the previous clock phase is retained. The signal present at output 5.1 of the first addition unit 3.1 changes according to the symbol values read in by the track/hold devices 4.

For the succeeding clock phase (cf. FIG. 12), the same track/hold devices 4 and the same addition unit 3 are again taken to the track, or hold mode, respectively, using clock signal $\phi$, as at the time shown in FIG. 10. The state (track phase or hold phase) of the various track/hold devices 4 corresponds to the state shown in FIG. 10. The same applies to the addition units 3.

The first track/hold device 4.1 of the lower branch is in the hold phase and retains the symbol value ("1") from the previous clock phase. However, the next symbol value present at input 1 ("2") is read into the first track/hold device 4.1 of the upper branch. Again, the output signals of the track/hold devices 4 in the delay chains 2 are shifted by one track/hold device 4 to the right compared to the previous clock phase (FIG. 11).

The second addition unit 3.2 is in the track phase such that an output signal is present at output 5.2 that is different from the one of the previous clock phase and depends on the symbol values ("1, 0, −1") present at the current clock phase at the outputs of the track/hold devices that are in the hold phase.

Figure 13:
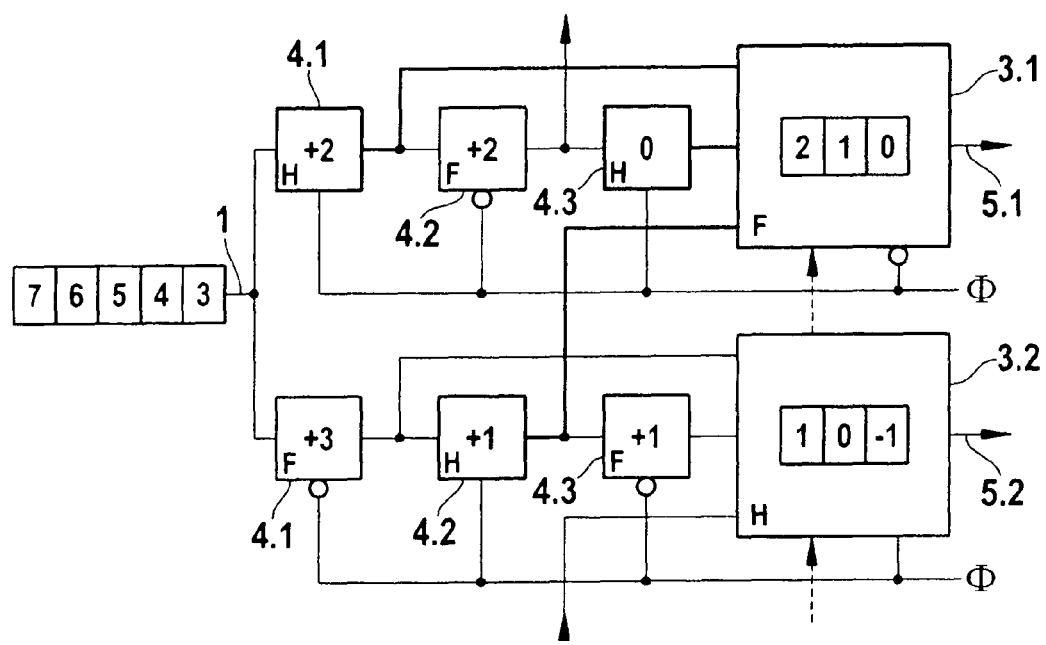
FIG. 13 shows a fourth switching state of the filter structure of FIG. 9.

At the next clock phase shown in FIG. 13, the track/hold devices 4 are again in the same state (hold phase or track phase) as in the next to the last clock phase shown in FIG. 11.

Figure 12:
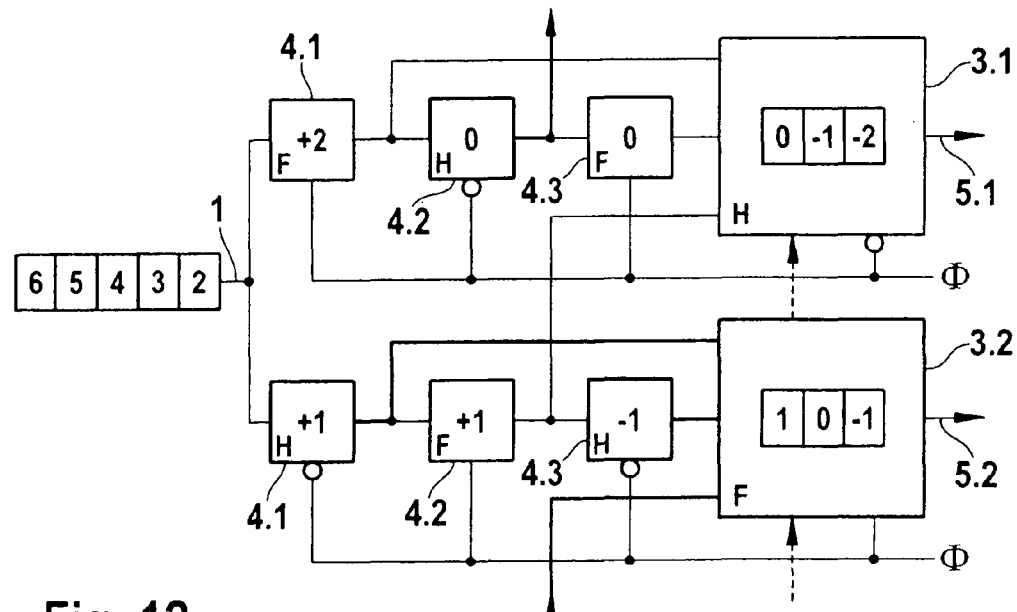
FIG. 12 shows a third switching state of the filter structure of FIG. 9.

The first track/hold device 4.1 of the upper branch retains the symbol value ("2") from the previous clock phase because it is in the hold phase. The first track/hold device 4.1 of the lower branch, on the other hand, is in the track phase and follows the input signal present at input 1. Thus, the next symbol value present at input 1 ("3") is transferred into the first track/hold device 4.1 of the lower branch. Again, the output signals of the track/hold devices 4 in the delay chains 2 are shifted by one track/hold device 4 to the right compared to the previous clock phase (FIG. 12). The second addition unit 3.2 is in its hold state and retains at its output 5.2 the output signal of the previous clock phase. Contrary to that, the first addition unit 3.1 is in its track state such that at the output 5.1 an output signal is present ("2, 1, 0") that is different from that in the previous clock phase and that depends on the symbol values present at the outputs of the track/hold devices, which are in the hold phase.

From FIGS. 10 to 13 and the associated description of the Figures, it is readily apparent that the track/hold devices 4 are toggled between a hold phase and a track phase. The addition units 3 too are toggled between track and hold. In addition, it becomes readily apparent that the equalized symbol values, which in this case correspond to the weighted addition of three consecutive sampled symbol values, are alternately present in the push-pull mode at the upper and lower outputs 5.1 and 5.2 of the addition units 3.1 and 3.2 and are available for a parallelized decision or for further processing at half of the processing rate. The symbol values present at input 1 are also fed in the incoming order alternating to the first track/hold device 4.1 of the upper or of the lower branch. This allows for the realization of an FIR filter structure with little space requirement and little electrical power requirements and where signal processing in the individual delay chains 2 and in the signal addition units 3 are slowed down by the factor ½ compared to the rate R of the incoming data symbols.

FIG. 14 shows an additional exemplary embodiment of the filter structure according to the invention. This exemplary embodiment comprises four branches parallel to each other, with two track/hold devices 4.1 and 4.2 being arranged in each of the branches. In addition, the filter structure comprises four addition units 3.1, 3.2, 3.3 and 3.4. Each of the addition units exhibits three inputs. The three inputs of the first addition unit 3.1 are connected to the output of the second track/hold device 4.2 of the (counted from the top) first branch, the output of the second track/hold device 4.2 of the second branch and the output of the first track/hold device 4.1 of the third branch. The inputs of the second addition unit 3.2 are connected to the outputs of the second track/hold devices 4.2 of the second and third branch and to the output of the first hold unit 4.1 of the fourth branch. The inputs of the third addition unit 3.3 are connected in a respective manner to the outputs of the second track/hold device 4.2 of the third and fourth branch and to the output of the first track/hold device 4.1 of the first branch. The inputs of the fourth addition unit 3.4 are connected to the second track/hold device 4.2 of the fourth and of the first branch and to the output of the first track/hold device 4.1 of the second branch.

Interweaving and cascading of the various track/hold devices 4 in the filter structure according to the invention exhibits rotational symmetry in this exemplary embodiment as well. There is no first and no last addition unit 3. Each addition unit 3 can be assigned to a branch i of the four branches, whereby the first input of an addition unit 3.*i* is always connected to second track/hold device 4.2 of the i-th branch to which the addition unit 3.*i* is assigned. Additional inputs of the addition unit 3.*i* are connected to the second track/hold device 4.2 of the subsequent branch (i+1) as well as to the output of the first track/hold device 4.1 of the branch following the next branch (i+2). This applies to all four addition units 3.*i*, whereby in the case that a subsequent or branch or one following the next is not present, as is the case, for example, for the fourth addition unit 3.4, one starts again from the beginning with the first and second branch with the first branch corresponding to the "subsequent" branch and the second branch to the one "following the next". In other words, i assumes the values 1, 2, 3, 4, and then again from the beginning 1, 2, 3, . . . and so on. In this manner, rotational symmetry exists in the filter structure.

Of course, the inputs of the addition units 3 can be assigned to the outputs of the track/hold devices 4 in a manner different from the one described. This is inevitably the case if the addition units 3 have more or fewer inputs than specified in the exemplary embodiment. In the same manner, addition units with three inputs can be connected to the outputs of other track/hold devices 4 than presented in exemplary fashion in FIG. 4. It is important, however, that the rotational symmetry described above, is retained.

In the exemplary embodiment of the present invention shown in FIGS. 14 to 18, inputs for the clock signal $\phi_{1to4}$ are located at the bottom of the track/hold device 4 and the addition units 3. Shown at the inputs is a type of clock with a pointer that points to 0:00, 3:00, 6:00 or 9:00 o'clock in the various track/hold devices 4. The position of the pointer symbolizes the particular phase of the multiphase clock signal $\phi_{1to4}$ that controls the respective track/hold device 4 or the respective addition unit 3. The following explanations are based on a multiphase clock signal $\phi_{1to4}$ with the individual clock signals $\phi_1$, $\phi_2$, $\phi_3$, $\phi_4$ exhibiting a clock ratio of 1:1.

Below, the function of the filter structure according to FIG. 14 at various consecutive clock phases is described in greater detail using FIGS. 15 to 18. In the shown exemplary embodiment, the track phases and the hold phases of the track/hold devices 4 and of the addition units 3 each comprise two consecutive clock phases. The various conditions (first part of the track phase, second part of the track phase) of the track/hold devices 4 and of the addition units 3 are designated with "F1", "F2", "H1", "H2" in FIGS. 15 to 18.

The second track/hold device 4.2 of the second branch, the first track/hold device 4.1 of the second branch, the first track/hold device 4.1 of the third branch and the second track/hold device 4.2 of the fourth branch are in the hold phase, with the second track/hold device 4.2 of the first branch and first track/hold device 4.1 of the third branch being in the first part of the hold phase and the first track/hold device 4.1 of the second branch and the second track/hold device 4.2 of the fourth branch being in the second part of the hold phase. In a corresponding fashion, the remaining track/hold devices 4 are in the track phase, whereby the first track/hold device 4.1 of the first branch and the second track/hold device 4.2 of the third branch are in first part of the track phase and the second track/hold device 4.2 of the second branch and the first track/hold device 4.1 of the fourth branch are in the second part of the track phase. In a corresponding fashion, the first addition unit 3.1 and the fourth addition unit 3.4 are in the track phase, with the first addition unit 3.1 being in the first part and the fourth addition unit 3.4 in the second part of the track phase. The second addition unit 3.2 and the third addition unit 3.3 are in the hold phase with the third addition unit 3.2 being in the first part and the second addition unit 3.2 being in the second part of the hold phase. At the point in time shown in FIG. 15, the track/hold devices 4 and the addition units 3 include symbol values from previous clock phases ("−6, −5, −4, −3, −2, −1").

Figure 15:
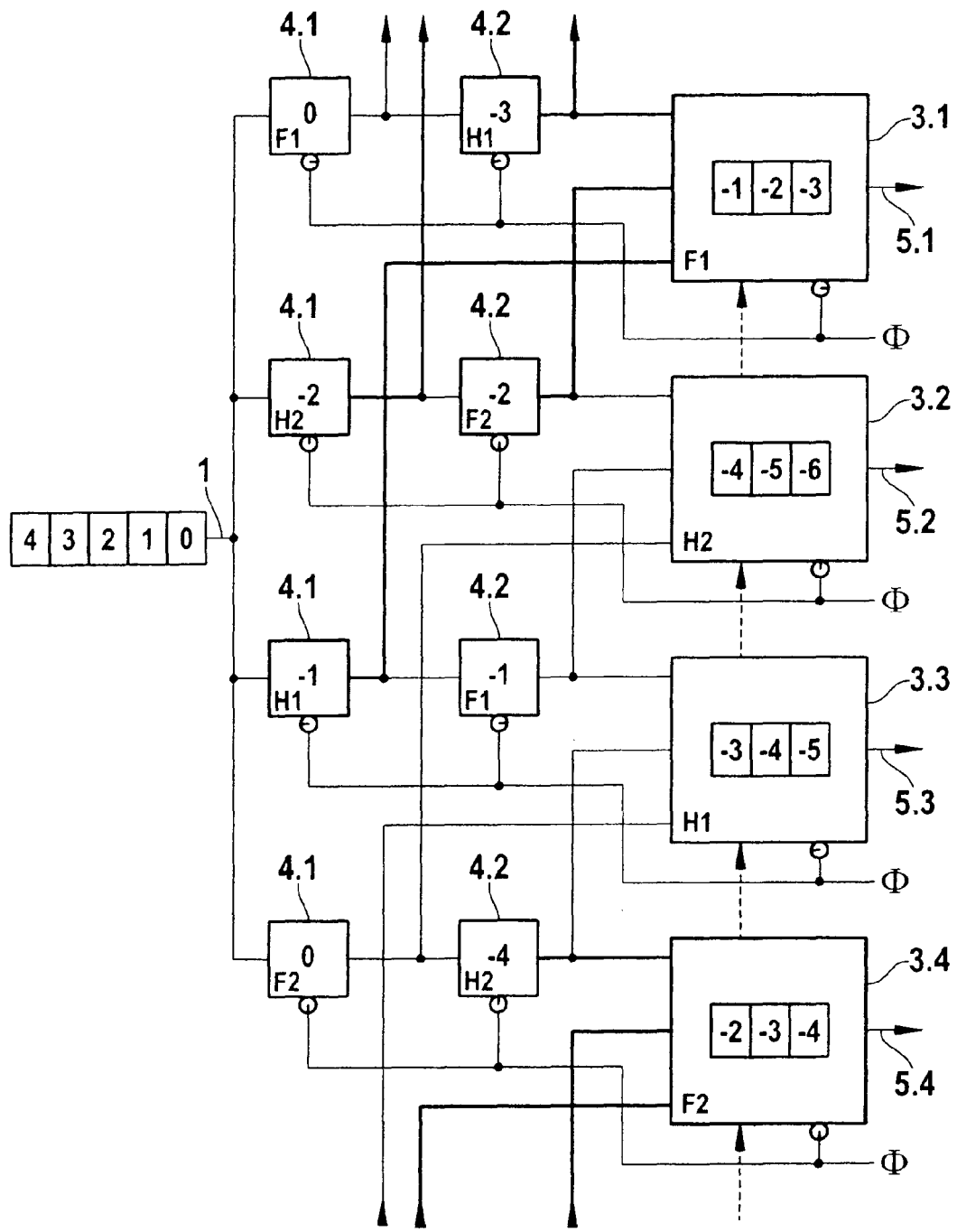
FIG. 15 shows a first switching state of the filter structure of FIG. 14.

At the beginning of the clock phase shown in FIG. 15, the first symbol value "0" is transferred from input 1 of the filter structure to the first track/hold devices 4.1 of the first and the last branch, which are both in the track phase. The second track/hold devices 4.2 of the second and the third branch are in the track phase as well. The respective first track/hold devices 4.1 of these branches are in the hold phase and retain the symbol values ("−2, −1") form the two previous clock signals. The two second track/hold devices 4.2 of the first and the fourth branch are also in the hold phase and retain the symbol values from the previous time clock signals ("−4, −3").

The two addition units 3.1 and 3.4, which are in the track state, read present symbol values of various branches at the outputs of selected track/hold devices 4. In particular, the symbol values of the outputs of the second track/hold device 4.2 of the first branch, the second track/hold device 4.2 of the second branch and the first track/hold device 4.1 of the third branch are present at the inputs of the first addition unit 3.1. Present at the fourth addition unit 3.4 are the symbol values of the outputs of the second track/hold device 4.2 of the fourth branch, of the second track/hold device 4.2 of the first branch and the first track/hold device 4.1 of the second branch. Present at the outputs 5.1 and 5.4 of the two addition units 3.1 and 3.4 are, corresponding to the read-in symbol values, modified output signals compared to the previous clock phase. The same applies to the third addition unit 3.3 that is in the second part of the hold phase.

Those addition units 3 that are in the track phase, i.e., in FIG. 15 the addition units 3.1 and 3.4, read in the symbol values present at the outputs of the connected track/hold devices 4, such that new output signals can come into existence at their outputs 5.1 and 5.4 depending on the read symbol values. The addition units 3.2 and 3.3 retain in FIG. 15 the output signal from the previous time clock signal.

Figure 16:
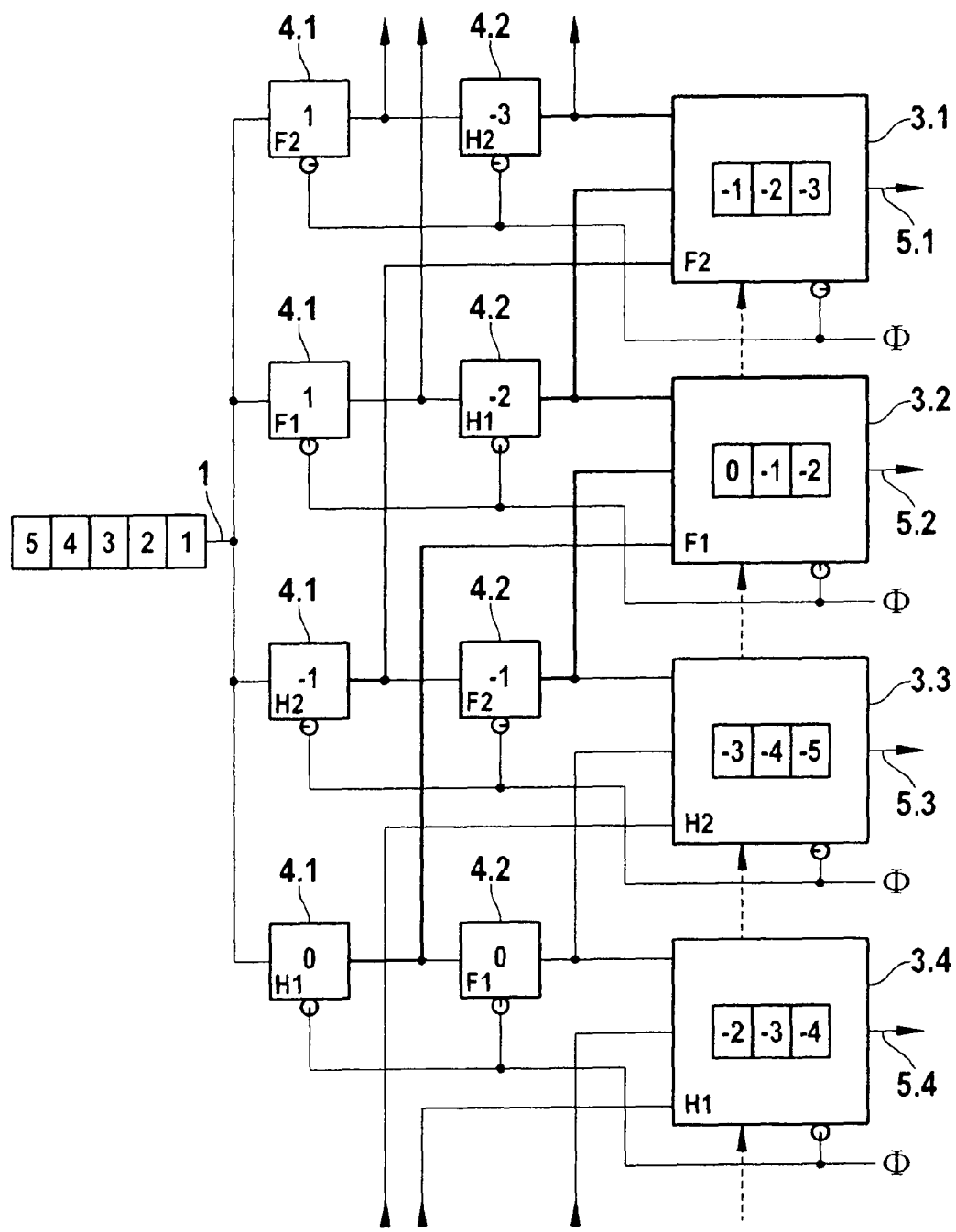
FIG. 16 shows a second switching state of the filter structure of FIG. 14.

At the beginning of the subsequent clock phase shown in FIG. 16, the track/hold devices 4 and the addition units 3 change their state rotation-symmetrically into the cyclically next state, i.e., from the first part of the hold phase to the second part of the hold phase, from the second part of the hold phase to the first part of the track phase, from the first part of the track phase to the second part of the track phase and from the second part to the first part of the hold phase and so on cyclically. The symbol values of the first track/hold devices 4.1 of the third and fourth branch of the filter structure ("−1", "0") from the previous clock phase shown in FIG. 15 are transferred at the clock phase shown in FIG. 16 to the respective subsequent track/hold device 4.2 of the respective branch. The next symbol value ("1") of the input signal that is present at the clock phase shown in FIG. 16 at input 1 of the filter structure is transferred to the first track/hold devices 4.1 of the first and second branch, which are both in the "track" state, the first track/hold device 4.1 of the first branch in the second part of the track phase and the first track/hold device 4.1 of the second branch in the first part of the track phase.

The second track/hold device 4.2 of the first branch changes at the beginning of the clock phase shown in FIG. 16 to the second part of the hold phase, and the second track/hold device 4.2 of the second branch changes from the second part of the track phase to the first part of the hold phase. Both track/hold devices 4.2 are at the clock moment shown in FIG. 16 in a hold phase such that the symbol value ("−3" or "−2", respectively) from the previous clock phase shown in FIG. 15 is retained. The first track/hold device 4.1 of the third branch changes to the second part of the hold phase such that here too the symbol value ("−1") from the previous clock phase is retained. The second track/hold device 4.2 of the third branch changes to the second part of the "track" state such that the symbol value ("−1") from the first track/hold device 4.1 of the previous clock phase (cf. FIG. 15) is transferred to the clock phase shown in FIG. 16 into the second track/hold device 4.2. The same applies to the second track/hold device 4.2 of the lower branch, which changes to the first part of the track phase and into which the symbol value ("0") of the first track/hold device 4.1 from the preceding clock phase is transferred, and to the second track/hold device 4.2 of the third branch, which changes to the second part of the track phase and into which the symbol value ("−1") of the first track/hold device 4.1 from the preceding clock phase is transferred.

In FIG. 16, the first and second addition unit 3.1 and 3.2 are in the track phase. The addition unit 3.2, at the clock phase shown in FIG. 16, reads in anew the symbol values that are present at the outputs of the connected track/hold devices 4, and builds a new signal value at its output 5.2 that depends on the read-in symbol values. The addition unit 3.1 continues to read in the values that have already been present at its inputs and continues to build the respective output signal at its output 5.1. The addition units 3.3 and 3.4, on the other hand, retain the output signal from the previous clock phase.

Figure 17:
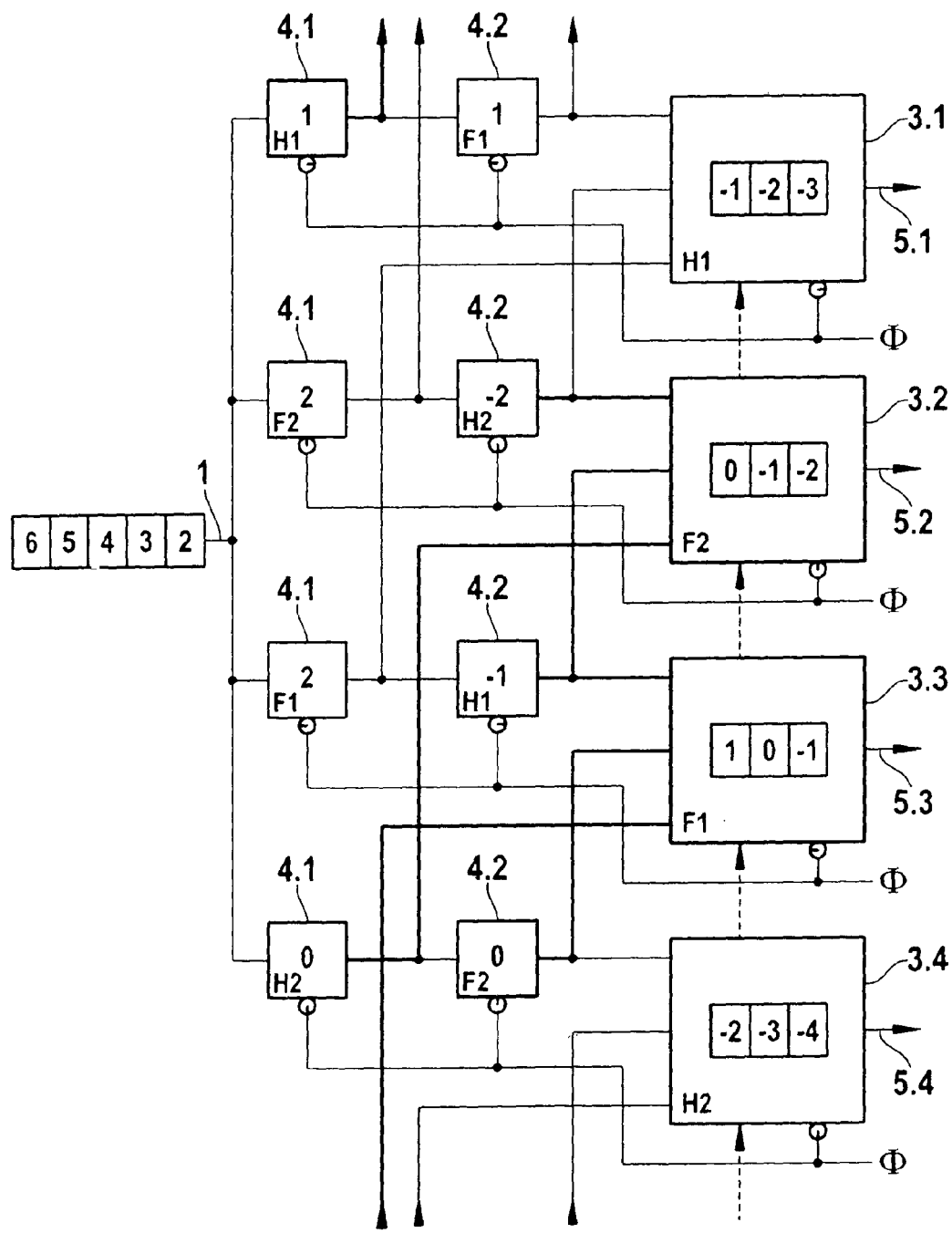
FIG. 17 shows a third switching state of the filter structure of FIG. 14.

The subsequent clock moment is shown in FIG. 17. The symbol values of the preceding clock phase (cf. FIG. 16) of the first track/hold devices 4.1 of the first and the last branch ("−1", "1") are passed on to the respective subsequent second track/hold device 4.2 of the respective branch. The first track/hold devices 4.1 of the two center branches are now in the track phase. The symbol value "2" now present at input 1 of the filter structure is, therefore, transferred to these two track/hold devices 4.1. The symbol values of the first track/hold devices 4.1 of the first and fourth branch of the filter structure from the previous clock phase shown in FIG. 16 are transferred at the clock phase shown in FIG. 17 to the respective subsequent track/hold device 4.2. The second track/hold device 4.2 of the second branch as well as the first track/hold device 4.1 of the lower branch retain their symbol values ("−2" or "0", respectively) from the preceding clock phase, because they transition into the second part of the hold phase at the clock phase shown in FIG. 17.

Now the second addition unit 3.2 and the third addition unit 3.3 are in the track phase. The addition unit 3.3 reads in anew at the clock phase shown in FIG. 17 the symbol values present at the outputs of the connected track/hold devices 4 and at the output 5.3 builds up a new signal value in dependence of the read in symbol values. The addition unit 3.2 continues to read in the values that have already been present at its inputs and at its output 5.2 continues to build the respective output signal. The first and last addition unit 3.1 and 3.4, on the other hand, retain the output signals present at their outputs 5.1 and 5.4 from the preceding clock phase because they are both in the hold phase.

Figure 18:
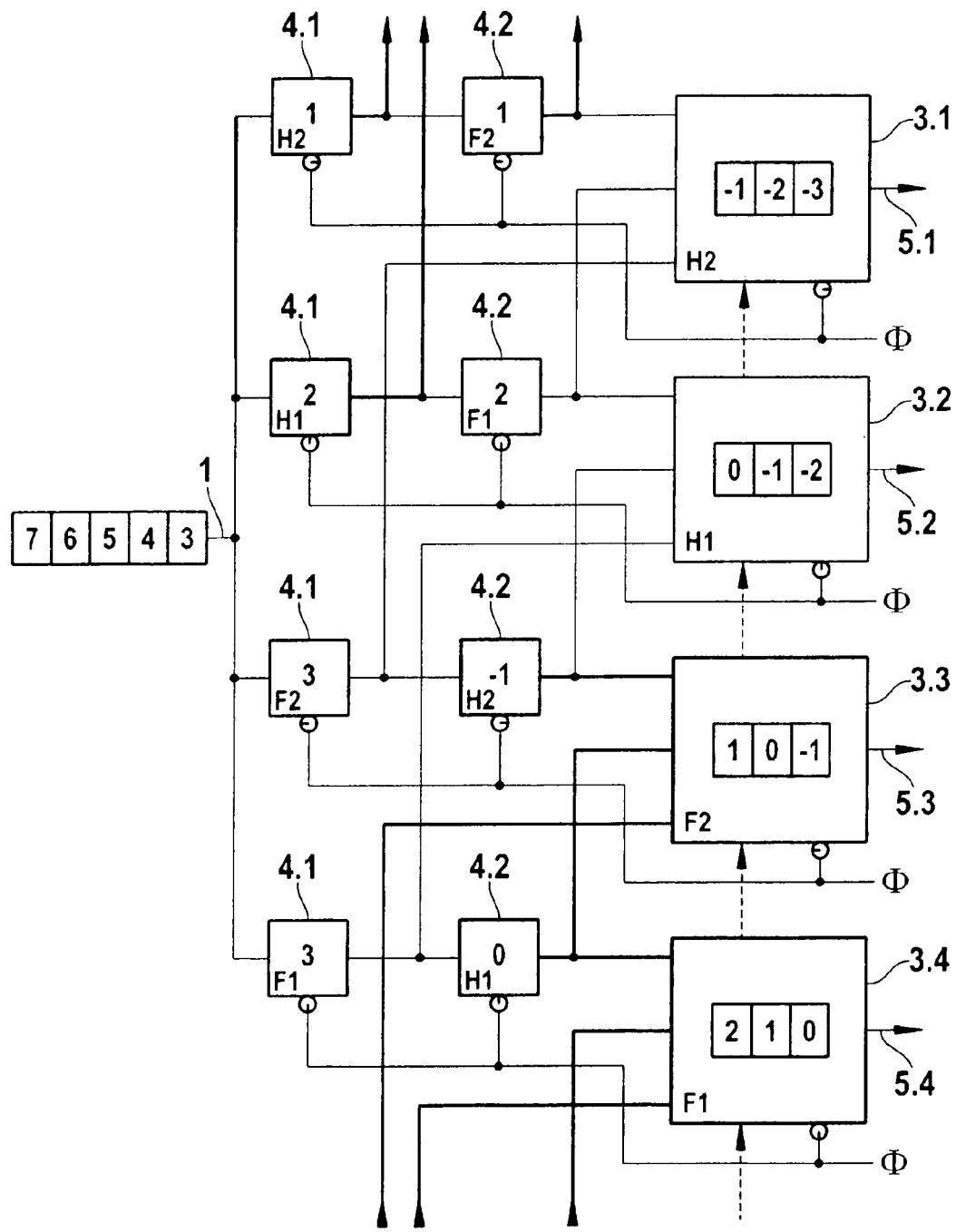
FIG. 18 shows a fourth switching state of the filter structure of FIG. 14.

Finally, FIG. 18 shows the block diagram of the filter structure from FIG. 14 at the time of the next clock phase. The symbol values from the preceding clock phase (cf. FIG. 17) of the first track/hold devices 4.1 of the first and the second branch ("1", "2") are transferred to the respective subsequent track/hold device 4.2 of the respective branch. The two first track/hold devices 4.1 of the third and fourth branch are in the track phase; the symbol value being present at input 1 at that time ("3") of the input signal is transferred to these two track/hold devices 4.1. The two first track/hold devices 4.1 of the first and of the second branch, on the other hand, are in the hold phase and retain the symbol value ("1" or "2", respectively) of the preceding clock phase. The same applies also to the two second track/hold devices 4.2 of the third and the last branch.

The two lower addition units 3.3 and 3.4 are in the track phase. The addition unit 3.4 reads in anew at the clock phase shown in FIG. 18 the symbol values present at the outputs of the connected track/hold devices 4, and at the output 5.4 builds up a new signal value in dependence of the read in symbol values. The addition unit 3.3 continues to read in the values that have already been present at its inputs and continues to build the respective output signal at its output 5.3. The two other addition units 3.1 and 3.2, on the other hand, are in the hold phase and retain the output signal from the previous clock phase.

It is immediately apparent that the equalized symbol values, which in this case correspond to the weighted addition of three consecutive sampled symbol values, are output in a staggered manner at the first output 5.1, then at the second output 5.2, then at the third output 5.3, then at the fourth output 5.4, then again at the first output 5.1 and so forth. The equalized symbol values are each present for the quadruple sampling period T at the respective output and are available for a parallelized decision or any other processing at a quartered processing rate.

The invention claimed is:

1. A filter structure comprising:
an input, where an input signal with a symbol rate is present,
several parallel branches connected to the input, with at least two analog clocked delay elements arranged consecutively with N being an even number,
several parallel signal addition units connected to outputs of the delay elements each with several weighted inputs, whereby the number of signal addition units is equal to the number of parallel branches, and
a control network that guides a multiphase clock signal with several individual clock signals, whereby the individual clock signals exhibit the same shape, are offset from each other by a sampling period duration and where the number of the individual clock signals of the multiphase clock signal equals the number of the parallel branches, and for controlling the delay elements with the multiphase clock signal, characterized in that
in each of the branches the same number of delay elements is arranged consecutively,
clock signals, which are provided for controlling delay elements that correspond to each other with regard to their position in the branches, are offset from each other by one sampling period duration,
clock signals, which are provided for controlling the signal addition units, each offset from each other by one sampling period duration,
clock signals, which are provided for controlling consecutive delay elements of a branch, each offset from each other by one half clock period duration, and
the signal addition units connected with the outputs of the delay elements in the branches, such that all signal paths between input of the filter structure and the respective inputs of the signal addition units weighted with the same weighting factor each are guided in various branches via the same number of delay elements and via corresponding delay elements with regard to their position.

2. A filter structure according to claim 1, characterized in that the clock signals, which are provided in consecutive branches for controlling delay elements that correspond to each other with regard to their position in the branches, each offset from each other by one sampling period duration, and in that the signal addition units are connected to the outputs of the delay elements in the branches, such in that all signal paths are guided in consecutive branches between the input of the filter structure and the inputs of the signal addition units weighted with the same weighting factor each via the same number of delay elements and via delay elements that correspond to each other with regard to their position in the branches, with the branch following the last branch of the filter structure being the first branch.

3. A filter structure as set forth in claim 1, characterized in that the analog clocked delay elements are designed as track/hold devices.

4. A filter structure as set forth in claim 1, characterized in that the analog clocked delay elements are designed as sampling hold units.

5. A filter structure as set forth in claim 1, characterized in that the filter structure exhibits $2^j$ parallel branches with j being a natural positive number except for zero.

6. A filter structure as set forth in claim 1, characterized in that an N-times parallelized decision feedback equalizer for additional filtering of the input signal is arranged following the signal addition units.

7. A filter structure as set forth in claim 1, characterized in that the degree of parallelism of the filter structure is N=2.

8. A filter structure as set forth in claim 1, characterized in that the weighting factors can be adjusted during operation of the filter structure for weighting the inputs of the signal addition units.

9. A method for filtering an input signal that is present at the input of a filter structure with a symbol rate, whereby
the input signal is guided via several parallel branches of the filter structure connected to the input, in each of which at least two analog-clocked delay elements are arranged consecutively, with N being an even number,
several (N) parallel signal addition units are connected to several inputs and outputs of the weighted delay elements, with the number of the signal addition units being selected to be equal to the number of the parallel branches, and
a multiphase clock signal with several individual clock signals is fed to the filter structure, whereby the individual clock signals exhibit the same shape, are offset to each other by a sampling period duration and the number of the individual clock signals of the multiphase clock signal is selected to equal the number of the parallel branches, and the delay elements are controlled by the multiphase clock signal,
characterized in that in each of the branches the same number of delay elements is arranged consecutively, such clock signals are used to control delay elements that correspond to each other with regard to their position in the branches, that are offset from each other by a sampling period duration, such clock signals are used for controlling consecutive delay elements of a branch, which are offset from each other by one half of a clock period duration, and in that the signal addition units are connected to the outputs of the delay elements in the branches such that all signal paths between the input of the filter structure and respective inputs of the signal addition units that are weighted with the same weighting factor are each guided in various branches via the same number of delay elements and via delay elements that correspond to each other with regard to their position in the branches.

10. A method as set forth in claim 9, characterized in that the clock signals, which are used in consecutive branches for controlling delay elements that correspond to each other with regard to their position in the branches, each offset from each other by one sampling period duration, and in that the signal addition units are connected to the outputs of the delay elements in the branches such that all signal paths between the input (1) of the filter structure and weighted with the same weighting factor according to the inputs of the signal addition units are each guided in consecutive branches via the same number of delay elements and via delay elements that correspond to each other with regard to their position in the branches, with the branch following the last branch of the filter structure being the first branch.

11. A method as set forth in claim 9, characterized in that the input signal is guided via $2^j$ parallel branches of the filter structure that are connected to the input with j being a natural positive number except for zero.

12. A method as set forth in claim 9, characterized in that an N-times parallelized decision feedback equalizer for additional filtering of the input signal is arranged following the signal addition units.

13. A method as set forth in claim 9, characterized in that the degree of parallelism of the filter structure is N=2.

14. A method as set forth in claim 9, characterized in that the weighting factors can be adjusted during operation of the filter structure for weighting the inputs of the signal addition units.

* * * * *